(12) United States Patent
Hsieh et al.

(10) Patent No.: US 7,667,261 B2
(45) Date of Patent: Feb. 23, 2010

(54) SPLIT-GATE MEMORY CELLS AND FABRICATION METHODS THEREOF

(75) Inventors: Chang-Jen Hsieh, Hsinchu (TW);
Hung-Cheng Sung, Hsinchu (TW);
Wen-Ting Chu, Kaohsiung (TW);
Chen-Ming Huang, Hsinchu (TW);
Ya-Chen Kao, Hsinchu (TW);
Shih-Chang Liu, Kaohsiung (TW);
Chi-Hsin Lo, Hsinchu (TW); Chung-Yi Yu, Hsinchu (TW); Chia-Shiung Tsai, Hsinchu (TW)

(73) Assignee: Taiwan Semiconductor Manufacturing Co., Ltd, Hsin-chu (TW)

( * ) Notice: Subject to any disclaimer, the term of this patent is extended or adjusted under 35 U.S.C. 154(b) by 0 days.

(21) Appl. No.: 11/785,382

(22) Filed: Apr. 17, 2007

(65) Prior Publication Data

US 2008/0105917 A1 May 8, 2008

Related U.S. Application Data

(63) Continuation-in-part of application No. 11/592,290, filed on Nov. 3, 2006.

(51) Int. Cl.
*H01L 29/788* (2006.01)
(52) U.S. Cl. .................. 257/316; 257/E29.3; 438/257
(58) Field of Classification Search ............... 438/257, 438/258, 261, 267; 257/314, 316, 326, 365, 257/366, E29.3
See application file for complete search history.

(56) References Cited

U.S. PATENT DOCUMENTS

| | | | | |
|---|---|---|---|---|
| 6,218,265 B1 * | 4/2001 | Colpani | ................. | 438/424 |
| 6,337,244 B1 * | 1/2002 | Prall et al. | ................. | 438/257 |
| 6,525,959 B1 * | 2/2003 | Fastow | ................. | 365/185.01 |
| 6,737,321 B2 * | 5/2004 | Lee | ................. | 438/264 |
| 6,743,675 B2 * | 6/2004 | Ding | ................. | 438/257 |
| 6,815,760 B2 * | 11/2004 | Leung et al. | ................. | 257/316 |
| 7,202,130 B2 * | 4/2007 | Liu et al. | ................. | 438/261 |

\* cited by examiner

*Primary Examiner*—David Vu
(74) *Attorney, Agent, or Firm*—Birch, Stewart, Kolasch & Birch, LLP

(57) ABSTRACT

Split-gate memory cells and fabrication methods thereof. A split-gate memory cell comprises a plurality of isolation regions formed on a semiconductor substrate along a first direction, between two adjacent isolation regions defining an active region having a pair of drains and a source region. A top level of the active regions is lower than a top level of the isolation regions. A pair of floating gates is disposed on the active regions and aligned with the isolation regions, wherein a passivation layer is disposed on the floating gate to prevent thinning from CMP. A pair of control gates is self-aligned with the floating gates and disposed on the floating gates along a second direction. A source line is disposed between the pair of control gates along the second direction. A pair of select gates is disposed on the outer sidewalls of the pair of control gates along the second direction.

18 Claims, 24 Drawing Sheets

SPLIT-GATE MEMORY CELLS AND FABRICATION METHODS THEREOF

CROSS-REFERENCE TO RELATED APPLICATIONS

The present application is a continuation-in-part of application Ser. No. 11/592,290, filed on Nov. 3, 2006, the entirety of which is incorporated herein by reference.

BACKGROUND OF THE INVENTION

1. Field of the Invention

The invention relates to electronic memory devices, and more particularly, to self-aligned split-gate memory cells with stacked control gate structures and fabrication methods thereof.

2. Description of the Related Art

Nonvolatile memory, including electrically programmable read only memory (EPROM), electrically erasable programmable read only memory (EEPROM), and flash EEPROM, is currently available in several forms for retaining stored data during periods when no power is applied. Conventionally, non-volatile memory comprises stacked gate and split gate cell structures. The stacked gate memory cells normally have a floating gate and a control gate, with the control gate positioned directly above the floating gate. In a split-gate memory cell, the control gate, while positioned above the floating gate, is laterally offset therefrom. A split-gate memory cell normally includes an additional gate known as a select gate which involves relatively complex processing steps.

In the manufacture of a split-gate memory cell, the floating gate pattern is commonly formed with one photolithographic mask, and the control gate or select gate pattern is then defined with another. U.S. Pat. Nos. 6,091,104 and 6,291,297, the entirety of which is hereby incorporated by reference, disclose a split-gate memory cell of relatively small size, efficient erasure performance, and relatively small programmable current requirements. The small size is obtained through self-alignment of the select, control and floating gates and the efficiency in erasure is provided by the use of Fowler-Nordheim tunneling from a sharply rounded side edge of the floating gate to the select gate. The programming current is kept small by the use of mid-channel hot carrier injection from the off-gate channel region between the select gate and the floating gate to the sharply curved side edge of the floating gate.

Flash memory cells with separated self-aligned select and erase gates are also disclosed in, for example, U.S. Pat. No. 6,747,310, the entirety of which is hereby incorporated by reference. FIG. 1A is a cross-section of a conventional self-aligned split-gate NOR-type flash memory cell, taken along line 2-2 in FIG. 1B. FIG. 1B is a plan view of the conventional self-aligned split-gate NOR-type flash memory cell. Typically, two memory cells 28 share an erase gate 29. Each cell 28 includes vertically stacked, self aligned floating and control gates 31 and 32. Each memory cell 28 also includes a select gate 33 positioned to one side of the stacked floating and control gates.

Source and drain diffusions 34, 36 are formed in the substrate 49, with programming paths extending from mid-channel regions in the substrate between the select gates and the stacked gates to the edge portions of the floating gates which face the select gates, and erase paths extending from the edge portions of the floating gates which face the erase gates to the source diffusion and to the erase gate.

An oxide layer (not shown) is thermally grown on a monocrystalline silicon substrate 49 which is patterned with strips of field oxide or shallow trench isolation 60 parallel to bit lines 67, as shown in FIG. 1B.

The conventional split-gate memory cell offers self-aligned control gate and floating gate to reduce memory cell space and provide better programming and erasure performance. The conventional floating gate, however, is not self-aligned with shallow trench isolation (STI) and source line (SL), thus hindering further scale-down of highly integrated memory applications.

BRIEF SUMMARY OF THE INVENTION

Accordingly, the invention is directed to split-gate memory cells with floating gates self-aligned with shallow trench insulator (STI) and source lines (SL). In one aspect of the invention, the source line (SL) is formed by forming a source polysilicon plug connected to a source area. In another aspect of the invention, the source line (SL) is formed by etching self-aligned source (SAS) and STI and sequentially implanting dopants to form a continuous source region.

The invention provides a split-gate memory cell, comprising a plurality of the isolation regions formed on a semiconductor substrate along a first direction, between two adjacent isolation regions defining an active region having a pair of drains and a source region, wherein a top level of the active regions is lower than the top level of the isolation regions. A pair of floating gates is disposed on the active regions and aligned with the isolation regions, wherein a passivation layer is disposed on the floating gate to prevent thinning from CMP. A pair of control gates is self-aligned with the floating gates and disposed on the floating gates along a second direction. A source line is disposed between the pair of control gates along the second direction, and a pair of select gates is disposed on the outer sidewalls of the pair of control gates along the second direction.

In an aspect of the invention, a split-gate memory cell comprises a plurality of the isolation regions formed on a semiconductor substrate along a first direction, between two adjacent isolation regions defining an active region having a pair of drains and a source region, wherein a top level of the active regions is lower than the top level of the isolation regions. A pair of floating gates is disposed on the active regions and aligned with the isolation regions, wherein a passivation layer is disposed on the floating gate to prevent thinning from CMP. A pair of control gates is self-aligned with the floating gates and disposed on the floating gates along a second direction. A source line directly connects the source region and is disposed between the pair of control gates along the second direction. A pair of select gates is disposed on the outer sidewalls of the pair of control gates along the second direction.

In another aspect of the invention, a split-gate memory cell comprises a plurality of the isolation regions formed on a semiconductor substrate along a first direction, between two adjacent isolation regions defining an active region having a pair of drains and a source region, wherein a top level of the active regions is lower than the top level of the isolation regions. A pair of floating gates is disposed on the active regions and aligned with the isolation regions, wherein a passivation layer is disposed on the floating gate to prevent thinning from CMP. A pair of control gates is self-aligned with the floating gates and disposed on the floating gates along a second direction. A source line electrically connects a continuous doped region and is disposed between the pair of control gates along the second direction, wherein the source line does not directly contact the source region. A pair of select gates is disposed on the outer sidewalls of the pair of control gates along the second direction.

The invention further provides a method for fabricating a split-gate memory cell, comprising providing a semiconductor substrate with a plurality of isolation regions along a first direction, between two adjacent isolation regions defining an active region, wherein a top level of the active regions is lower than the top level of the isolation regions. A pair of floating gates is formed on the active regions and aligned with the isolation regions, wherein a passivation layer is conformably deposited on the floating gate to prevent thinning from CMP. An oxide-nitride-oxide (ONO) layer, a polysilicon layer, and an oxide layer are sequentially deposited on the semiconductor substrate. A pair of control gate stacks is defined along a second direction, self-aligning with the pair of floating gates. A source line is formed between the pair of control gates and simultaneously a pair of select gates is formed on the outer sidewalls of the pair of control gates along the second direction.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention is directed to split-gate non-volatile memory cells with a floating gate (FG) self-aligned with shallow trench insulators (STI) along a first direction. A control gate (CG) is defined by lithography and self aligned with the floating gate. Moreover, the floating gate is self-aligned with a source line along a second direction. In one aspect of the invention, the source line is formed by a polysilicon source plug directly connected to a source region. In another aspect of the invention, the source line is formed by a self-aligned source (SAS) procedure associated with an SAS-STI etching procedure, and followed by source line implantation. The select gate (SG) is defined by CG/FG spacers and self-aligned with FG.

Figure 1A:
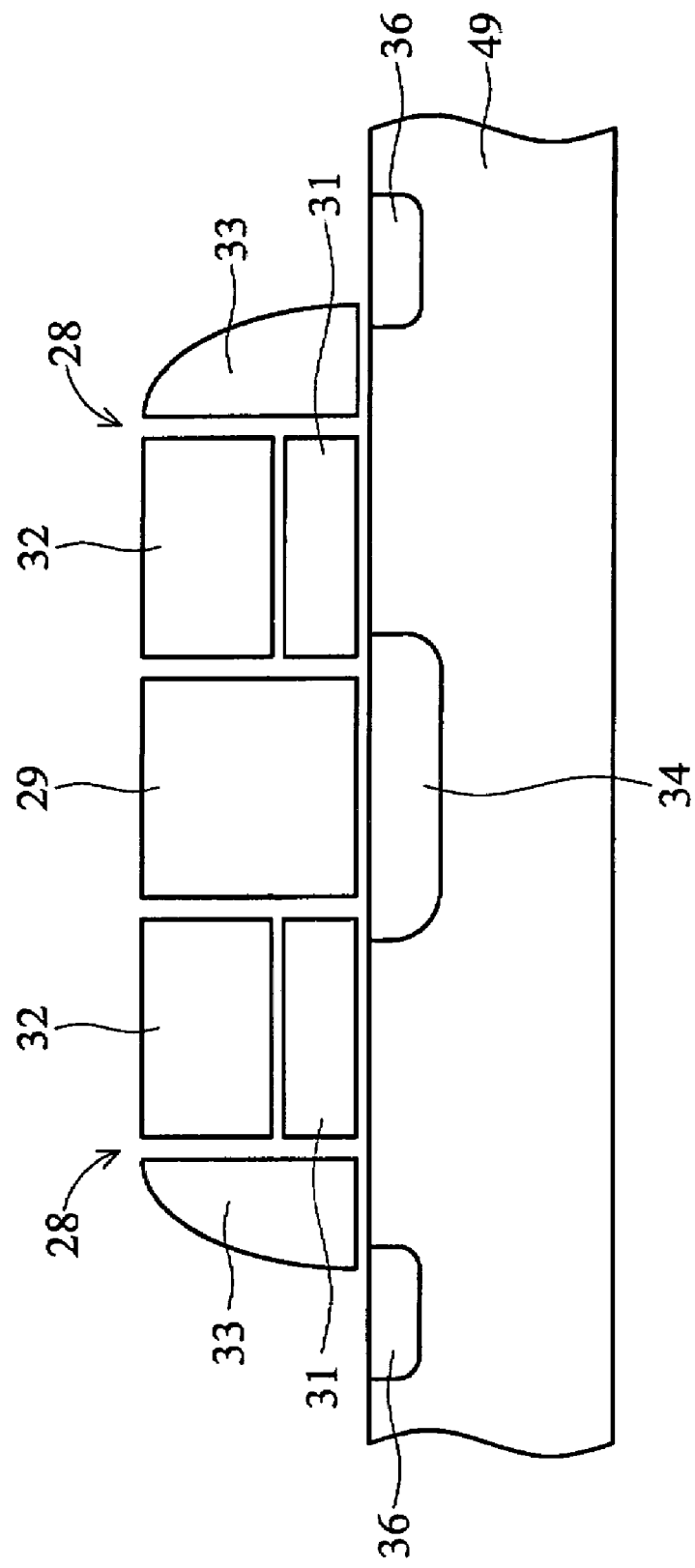
FIG. 1A is a cross section of a conventional self-aligned split-gate NOR-type flash memory cell, taken along line 2-2 in FIG. 1B.
Figure 1B:
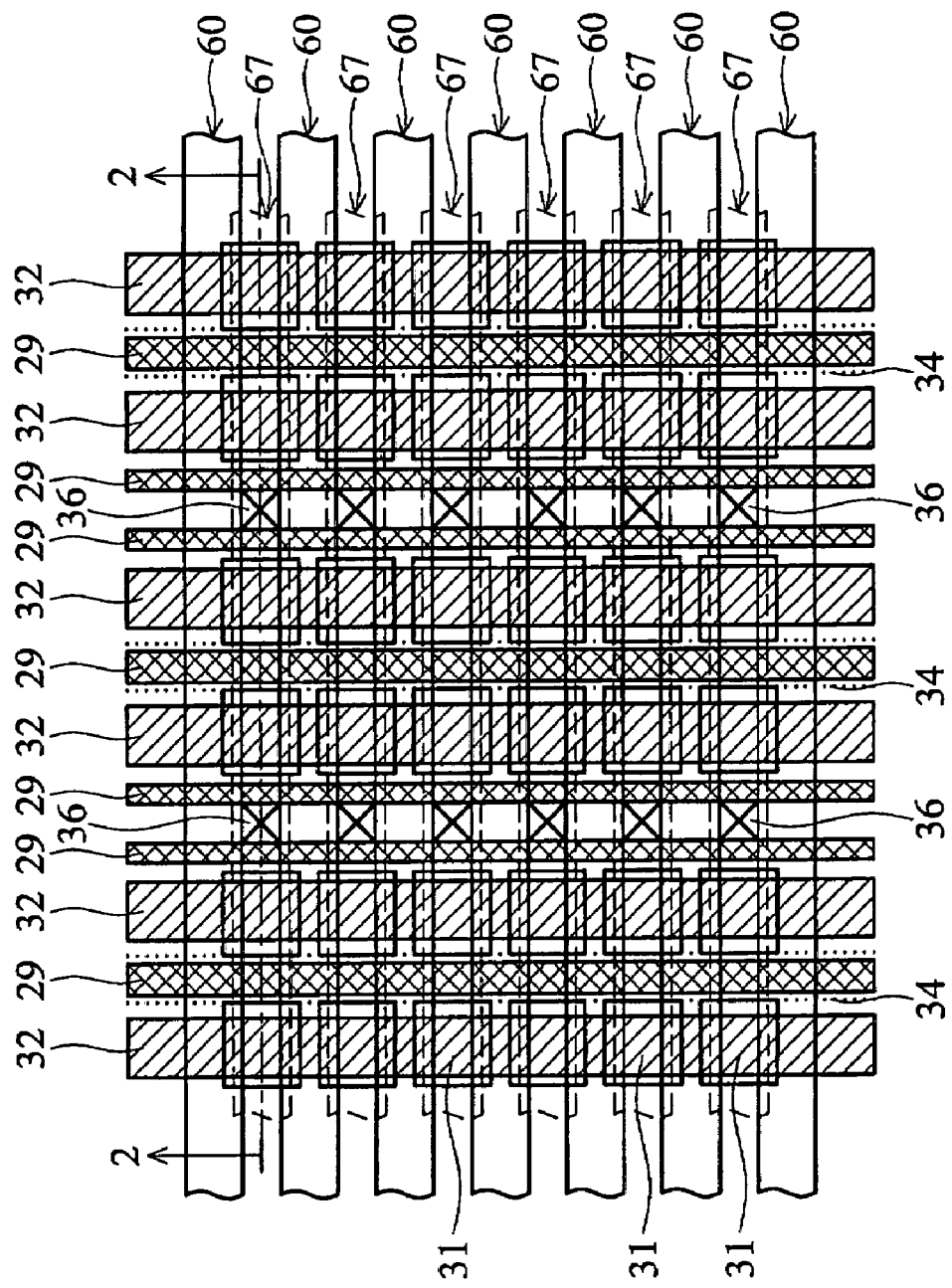
FIG. 1B is a plan view of a conventional self-aligned split-gate NOR-type flash memory cell.
Figure 2A:
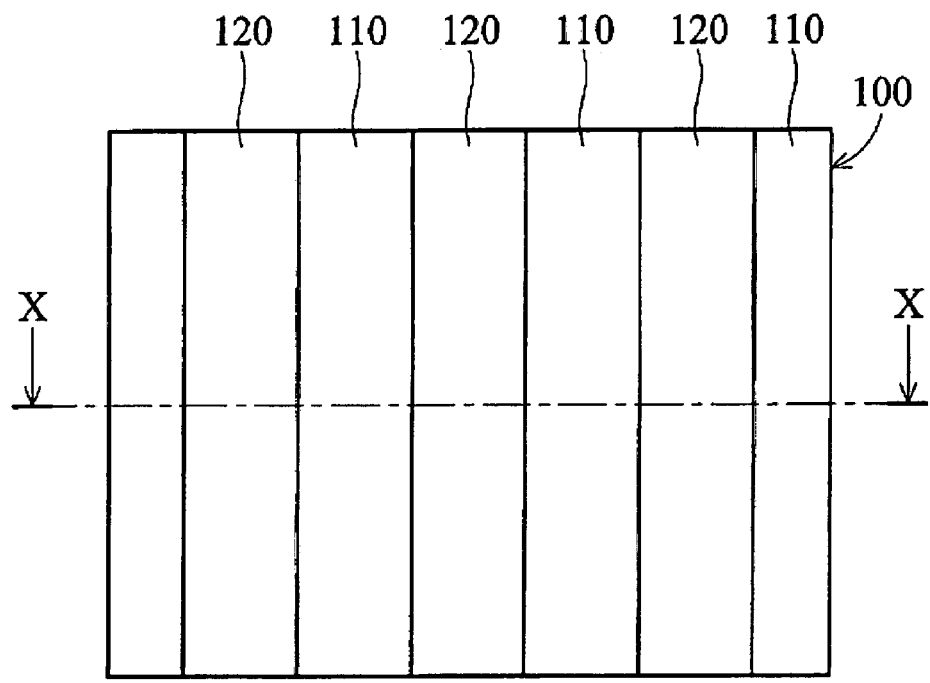
FIG. 2A is a plan view of a semiconductor substrate with adjacent isolation regions along a first direction.
Figure 2B:
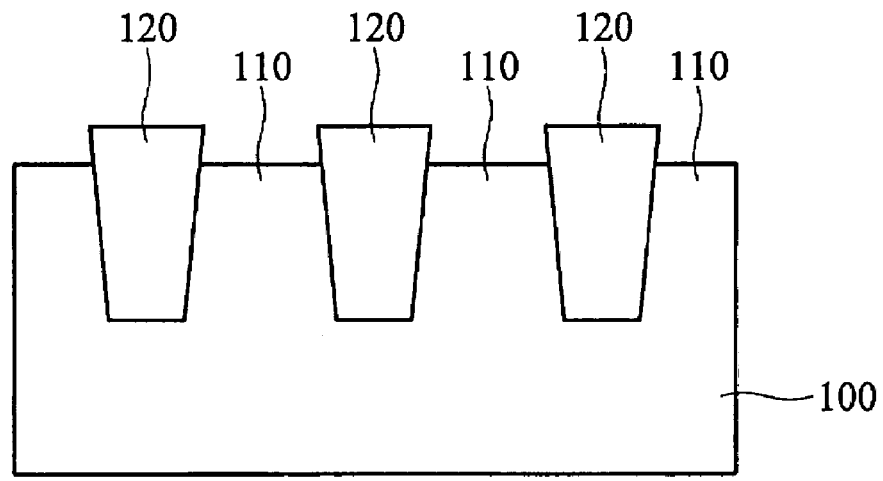
FIG. 2B is a cross section of the semiconductor taken along line X-X of FIG. 2A.

FIG. 2A is a plan view of a semiconductor substrate with adjacent isolation regions along a first direction. FIG. 2B is a cross section of the semiconductor substrate taken along line X-X of FIG. 2A. Referring to FIG. 2A, a semiconductor substrate 100, such as a P type semiconductor substrate, comprising a single crystalline silicon wafer with a <100> crystallographic orientation, is provided. A plurality of parallel adjacent isolation regions 120 is formed on a semiconductor substrate 100 along a first direction. An active region 110 is defined between the adjacent isolation regions 120. Isolation regions 120, either silicon oxide, shallow trench isolations (STI), or silicon dioxide, or field oxide regions (FOX), are formed to define electrically separated active regions 110. The top level of the active region 110 is lower than the top level of the isolation region 120.

Figure 2C:
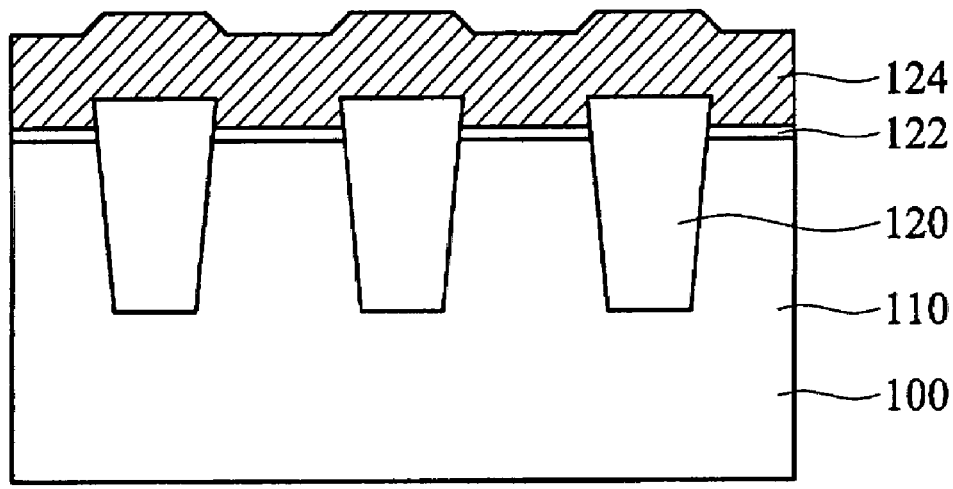
FIGS. 2C-2D are cross sections of formation of an oxide layer and a polysilicon layer on the semiconductor substrate taken along line Y-Y of FIG. 2A.
Figure 2D:
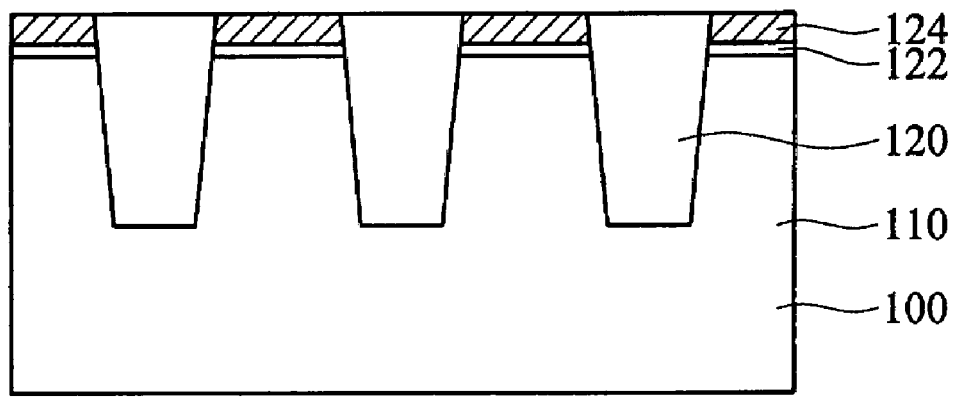

FIG. 2C is a cross section of formation of an oxide layer and a polysilicon layer on the semiconductor substrate. In FIG. 2C, an oxide layer 122 is formed on the substrate 100. The oxide layer 122 can be obtained using rapid process oxidation (RPO) or via low pressure chemical vapor deposition (LPCVD) or plasma enhanced chemical vapor deposition (PECVD). A polysilicon layer 124, such as a $PH_3$-doped polysilicon, can be formed by chemical vapor deposition (CVD). The semiconductor substrate 100 is sequentially planarized by chemical mechanical planarization (CMP) partially leaving the oxide layer 122 and the polysilicon layer 124 on the active region 110 and exposing the isolation regions 120. The oxide layer 110 and polysilicon layer 120 on the active region 120 are thus self-aligned with and parallel to the isolation regions 120 along the first direction and serve as a floating gate (FG) of the memory cell as shown in FIG. 2D.

Figure 2E:
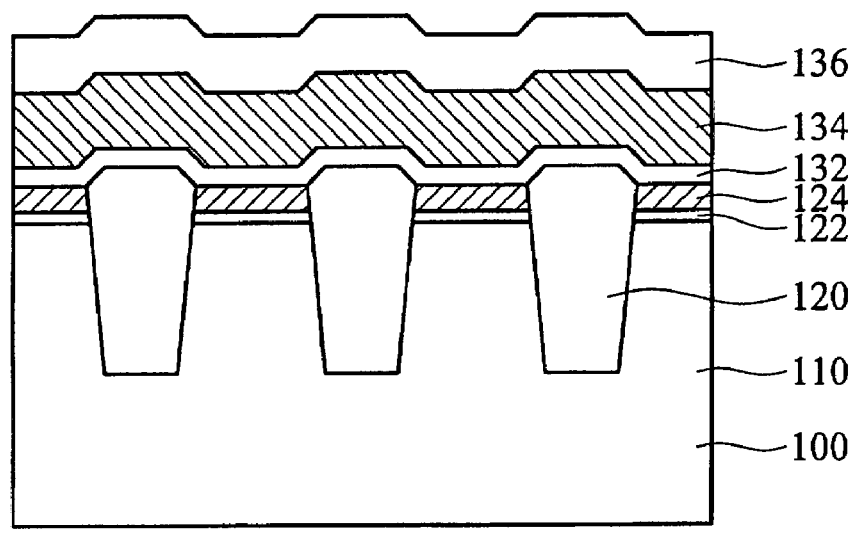
FIG. 2E is a plan view of formation of an oxide-nitride-oxide (ONO) stacked layer on the semiconductor substrate.

FIG. 2E is a cross section of formation of an oxide-nitride-oxide (ONO) stacked layers on the semiconductor substrate. A stacked layer comprises a first silicon oxide layer, a silicon nitride layer and a second oxide layer (ONO) 132 sequentially deposited on the semiconductor substrate 100. The ONO stacked layer 132 preferably consists of a bottom layer of oxide having a thickness of 30-100 Å, a central layer of nitride having a thickness of 50-300 Å, and a top layer of oxide having a thickness of 30-100 Å. A polysilicon layer 134 is formed on the semiconductor substrate 100. The polysilicon layer 134 can be doped in situ during deposition, via the addition of arsine or phosphine to a silane ambient. Alternatively, the polysilicon layer 134 can be deposited intrinsically then doped via implantation of arsenic or phosphorous ions. An oxide layer or an anti-reflection coating (ARC) layer 136 is formed on the polysilicon layer 134.

Figure 2F:
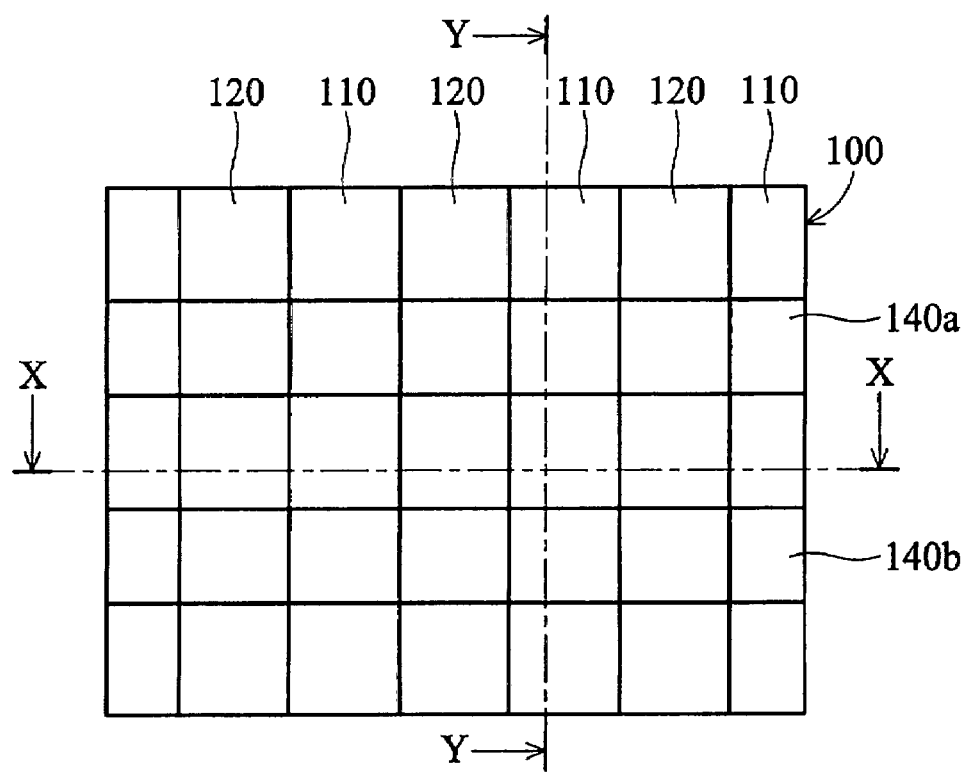
FIG. 2F is a plan view of a semiconductor substrate with polysilicon layer 134 and the ARC layer 136 patterned along a second direction.
Figure 2G:
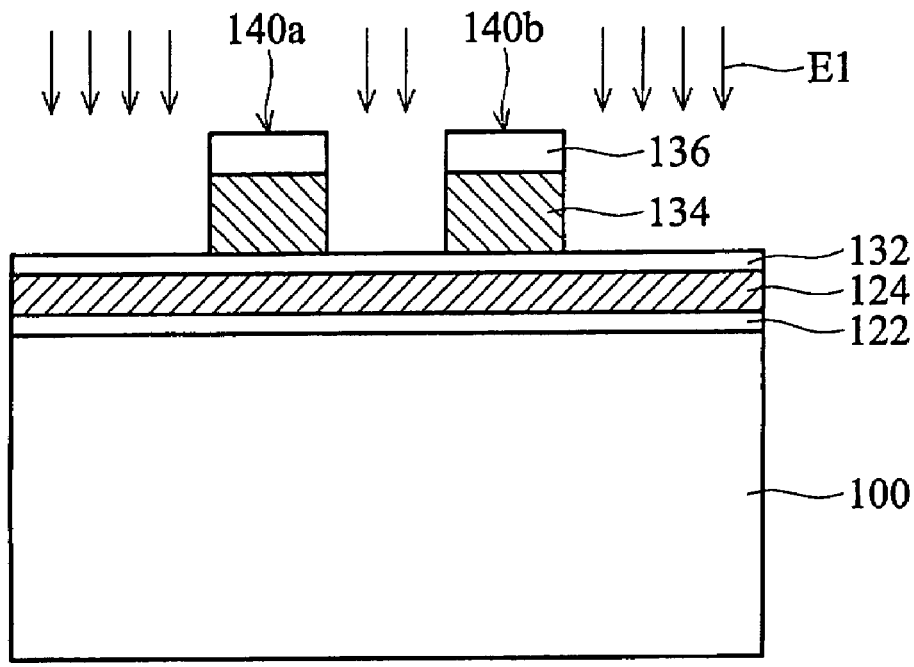
FIG. 2G is a cross section of the semiconductor substrate taken along line Y-Y of FIG. 2F.
Figure 2H:
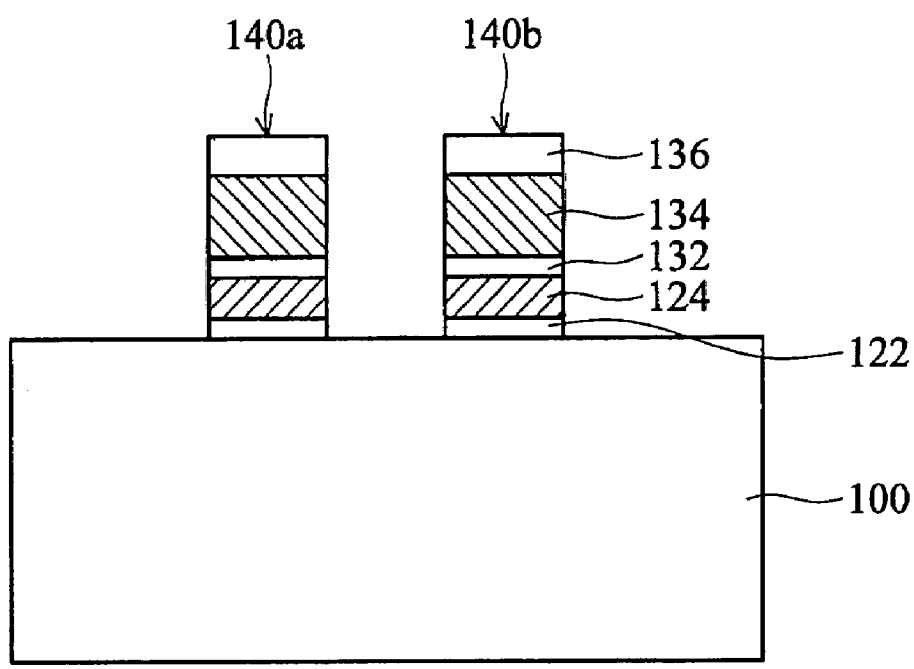
FIG. 2H is a cross section of an exemplary embodiment of the pair of stacked structures and including the control gates self aligned with the floating gates.

FIG. 2F is a plan view of a semiconductor substrate with the polysilicon layer 134 and the ARC layer 136 patterned along a second direction. FIG. 2G is a cross-section of the semiconductor substrate taken along line Y-Y of FIG. 2F. The ARC layer 136 and the polysilicon layer 134 are patterned by anisotropic etching along the second direction, such as a reactive ion etching (RIE) procedure, using etchant such as $Cl_2$ or $SF_6$. The ONO stacked layer 134 is subsequently etched E1 along the second direction. A pair of stacked structures 140a and 140b are thus formed along the second direction to serve as control gates (CG) of the split-gate memory cell. The pair of stacked structures 140a and 140b including the control gates self aligned with the floating gates are shown in FIG. 2H.

In one aspect of the invention, source lines of the split gate memory cell can be formed by a polysilicon source plug directly connected to a source region.

Figure 3A:
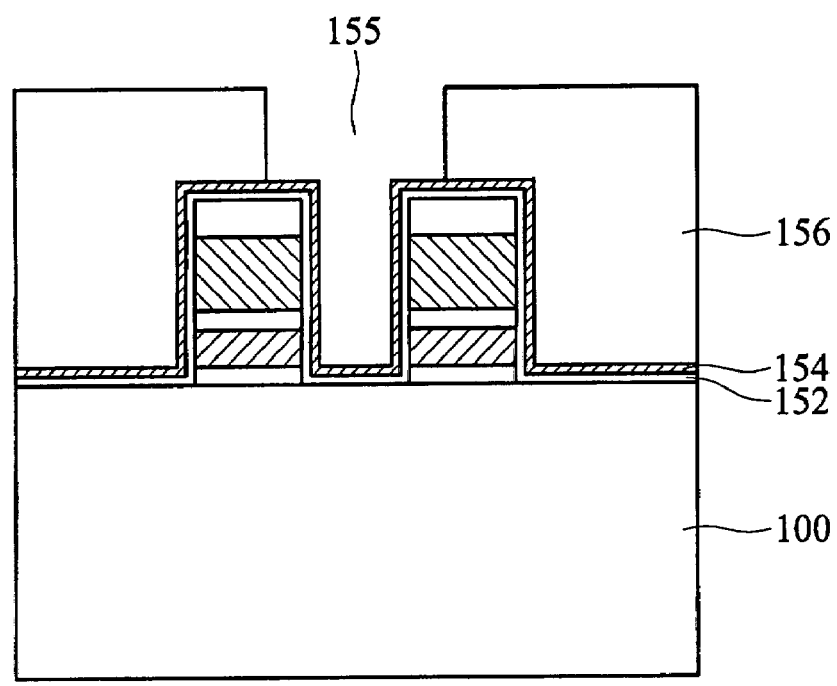
FIG. 3A is a cross section showing formation of an oxide layer and a nitride layer on the semiconductor substrate.

FIG. 3A is a cross section showing formation of an oxide layer and a nitride layer on the semiconductor substrate. In FIG. 3A, a thin oxide layer 152 and a nitride layer 154 are conformably formed on the semiconductor substrate 100. A photoresist layer 156 is formed on the nitride layer 154. An opening 155 is lithographically developed in the photoresist layer 152 exposing a portion of stacks 140a and 140b and a region there between.

Figure 3B:
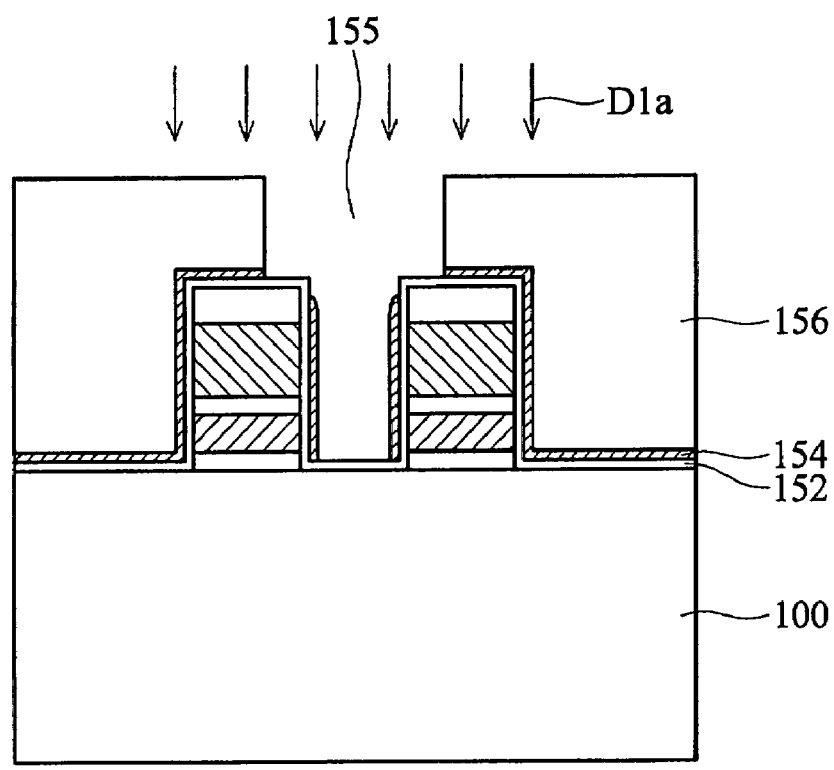
FIGS. 3B-3C are cross sections showing anisotropic etching performed on the semiconductor substrate.
Figure 3C:
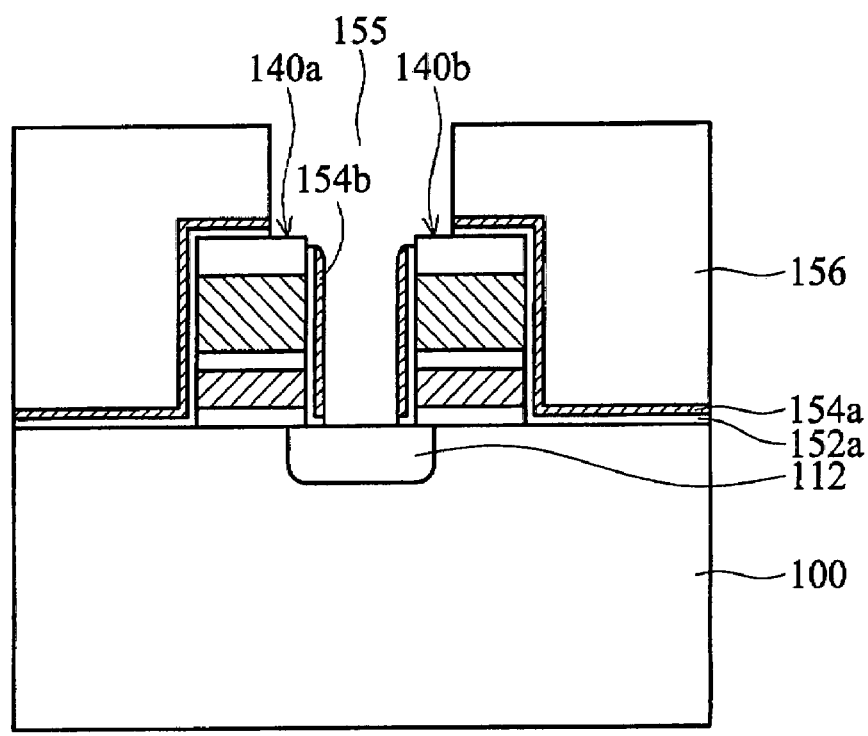

FIG. 3B is a cross section showing anisotropic etching performed on the semiconductor substrate. Anisotropic etching, such as reactive ion etching (RIE) is performed on the semiconductor substrate 100, removing a portion of the nitride layer 154. The top surface of the oxide layer 152 on the stacked structures is thus exposed. Ion implantation D1a is sequentially performed to implant dopants into the semiconductor substrate 100 to create a source region 112. The exposed oxide layer 152 is further etched exposing the surface of the source region 112 and a portion of the pair of stacks 140a and 140b as shown in FIG. 3C.

Figure 3D:
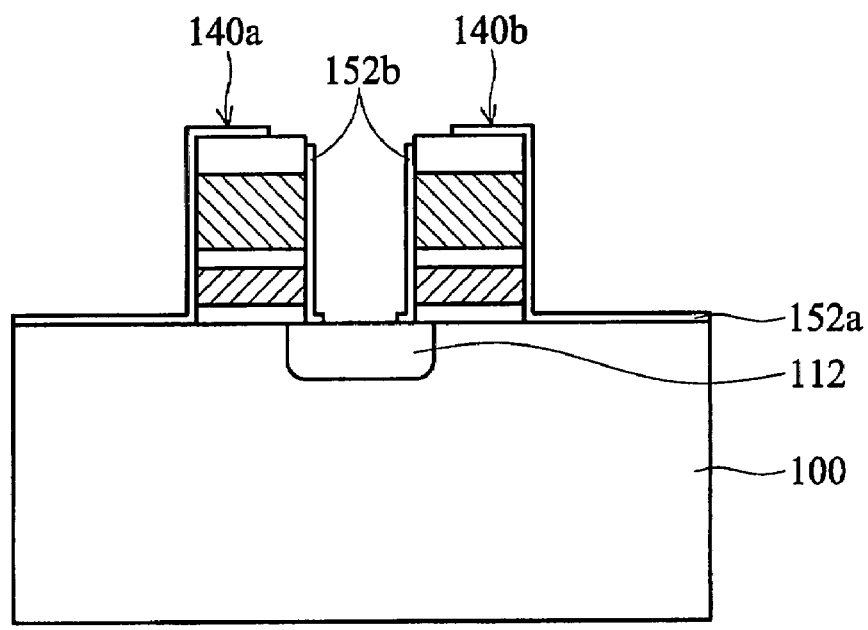
FIG. 3D is a cross section showing removal of the patterned photoresist layer from the semiconductor substrate.

FIG. 3D is a cross section showing removal of the patterned photoresist layer from the semiconductor substrate. In FIG. 3D, the patterned photoresist layer 156 is stripped from the semiconductor substrate 100. The nitride layer 154 is sequentially removed leaving oxide layer 152a on the semiconductor substrate 100.

Figure 3E:
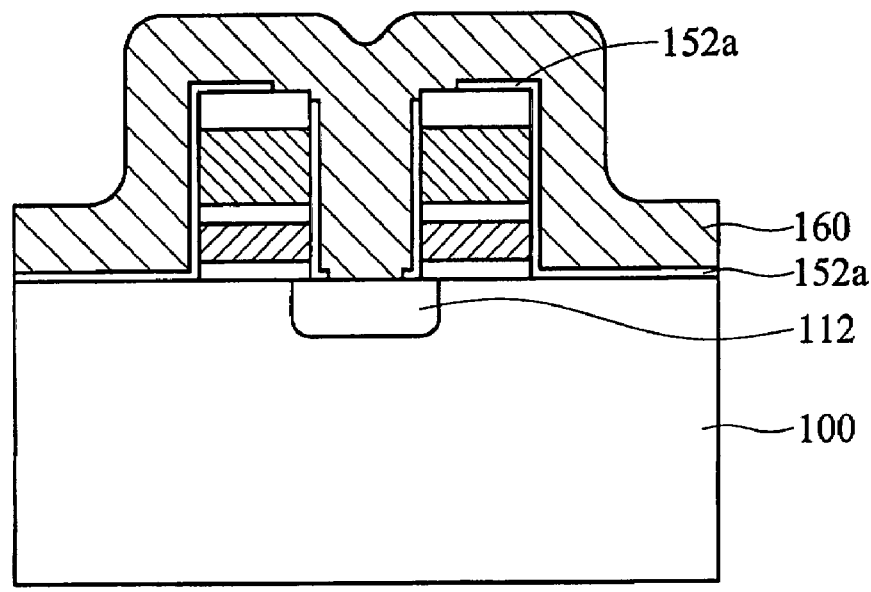
FIG. 3E is a cross section showing deposition of a polysilicon layer on the semiconductor substrate.

FIG. 3E is a cross section showing deposition of a polysilicon layer on the semiconductor substrate. A polysilicon layer 160 is conformably formed on the semiconductor substrate 100. The polysilicon layer 160 can be doped in situ during deposition, via the addition of arsine or phosphine to a silane ambient. Alternatively, the polysilicon layer 160 can be deposited intrinsically then doped via implantation of arsenic or phosphorous ions.

Figure 3F:
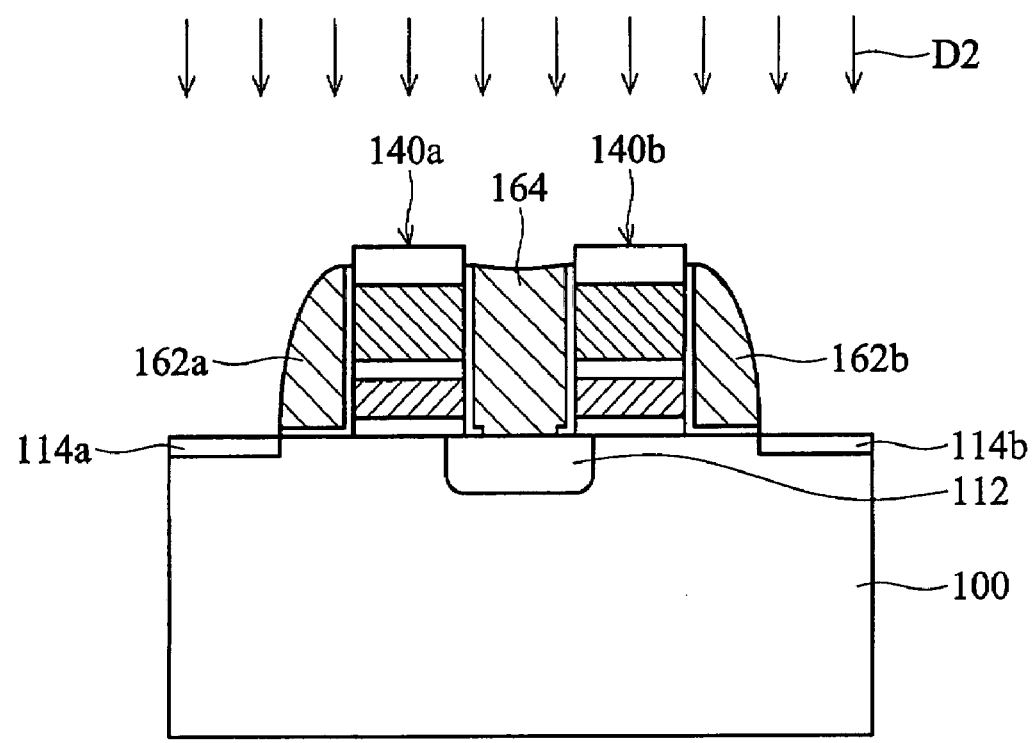
FIG. 3F is a cross section showing creation of source lines and selected gates on the semiconductor substrate.

FIG. 3F is a cross section showing creation of source lines and selected gates on the semiconductor substrate. Anisotropic etching such as RIE is employed to create a source line (SL) 164 between the pair of control gates 140a and 140b along the second direction. The source line 164 is a polysilicon source plug directly connected to the source region 112. A pair of select gates 162a and 162b are simultaneously created on the outer sidewalls of the pair of control gates 140a and 140b along the second direction. Floating gates (FG) are self-aligned with the source line (SL). A pair of light doped drain/sources (LDD) 114a and 114b is formed in the semiconductor substrate 100 by ion implantation D2.

Figure 3G:
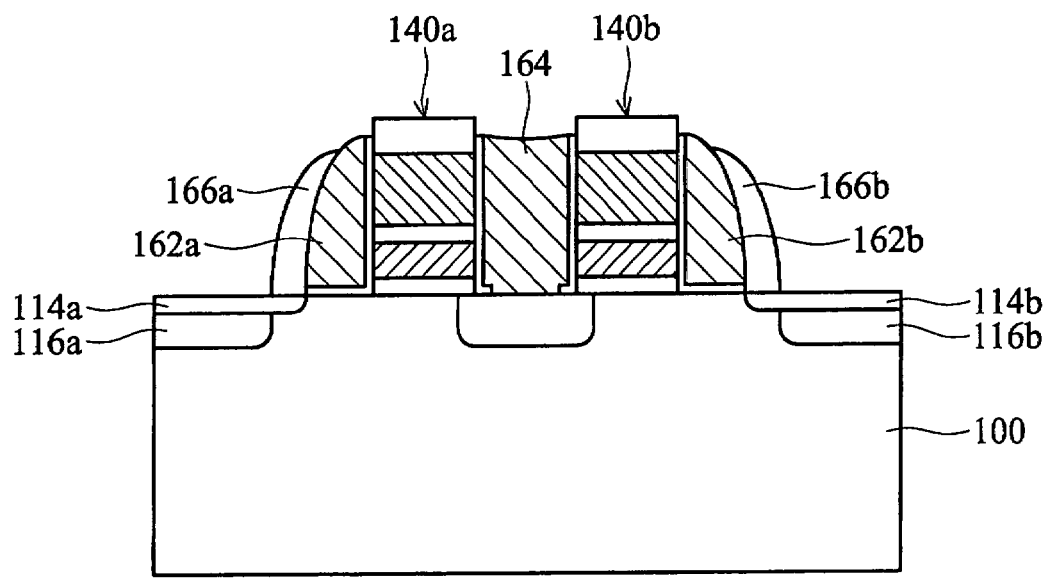
FIG. 3G is a cross section showing formation of dielectric spacers on the sidewalls of the select gates.

FIG. 3G is a cross section showing formation of dielectric spacers on the select gates. A dielectric layer is conformably formed on the semiconductor substrate 100 and anisotropically etched partially leaving dielectric spacers 166a and 166b on the select gates 162a and 162b. Critical anisotropic etching is performed via RIE procedures terminated at dielectric spacers 166a and 166b on the sidewall of the select gates 162a and 162b.

Ion implantation is subsequently performed to create a pair of highly doped drain/source (HDD) regions 116a and 116b in the semiconductor substrate 100. Ion implantation is preferably performed using arsenic or phosphorous ions at a doping energy between about 35 to 50 KeV, at a dose between about $1 \times 10^{14}$ and $6 \times 10^{15}$ atoms/cm$^2$, forming heavily doped, N type drain regions 116a and 116b in areas not covered by the control gate and dielectric spacers structures.

Figure 3H:
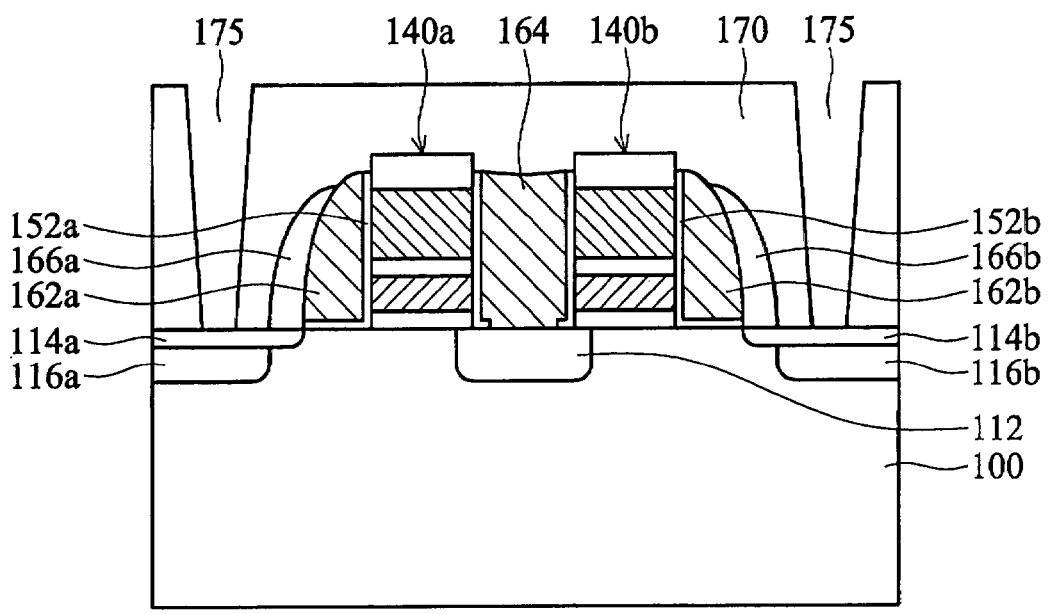
FIG. 3H is a cross section showing formation of an interlayer dielectric (ILD) on the semiconductor substrate.

FIG. 3H is a cross section showing formation of an interlayer dielectric (ILD) on the semiconductor substrate. In FIG. 3H, an ILD layer 170 is patterned forming openings 175 exposing the drain regions 116a and 116b.

Figure 3I:
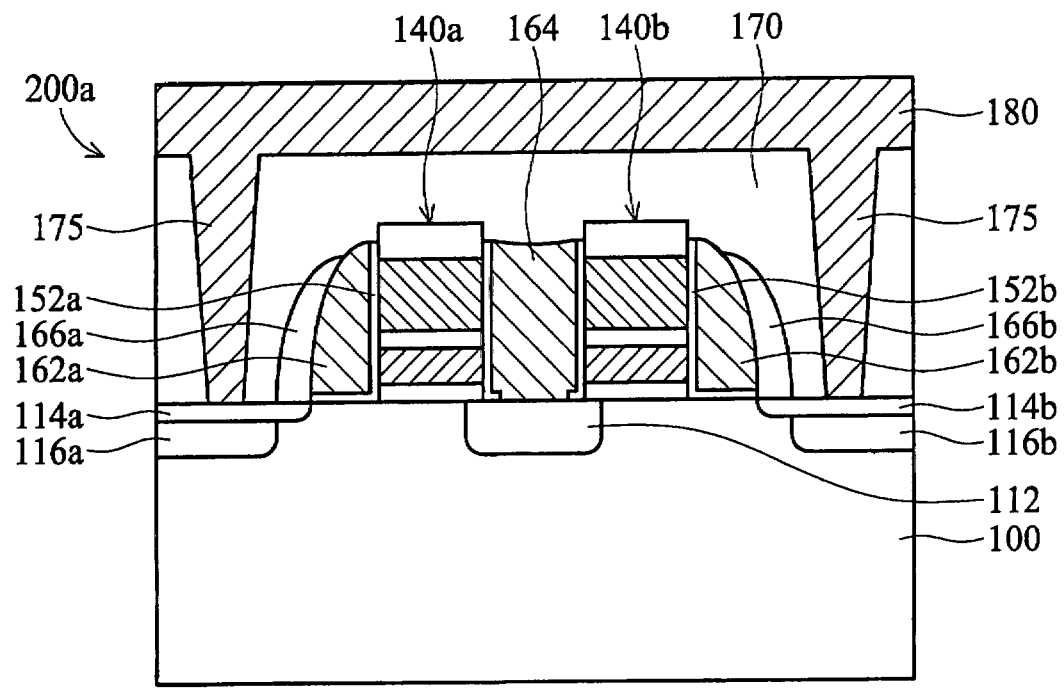
FIG. 3I is a cross section showing metallization of bit lines and contact plugs of the split-gate memory.

FIG. 3I is a cross section showing metallization of bit lines and contact plugs of the split-gate memory. A metal layer 180 is formed on the ILD layer 170 filling the opening 175 to serve as metal contact. For example, metallization is subsequently applied and etched to form bit lines 180 and self-aligned bit line contacts 185.

Figure 3J:
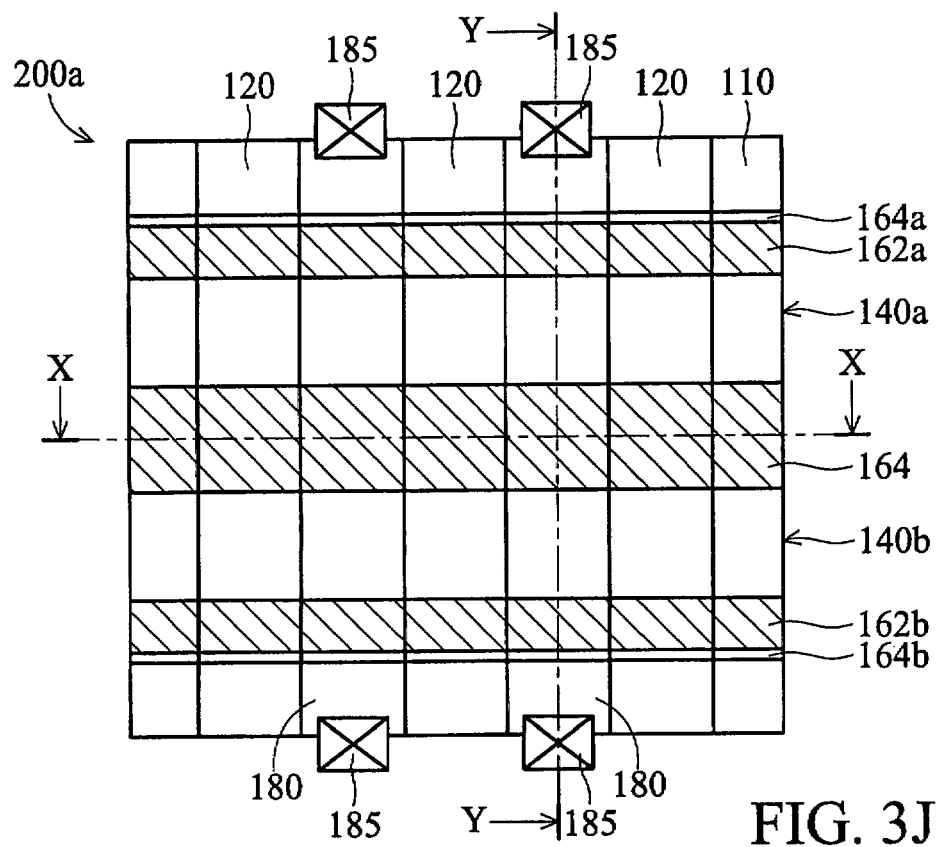
FIG. 3J is a plan view of a split-gate memory cell according to an embodiment of the invention.

Accordingly, in an aspect of the invention, a split-gate nonvolatile memory cell 200a is provided. Adjacent isolation regions 120 are formed on a semiconductor substrate 100 along a first direction. The adjacent isolation regions 120 define an active region 110 having a pair of drains 116a, 116b and a source region 112, wherein the top level of the active region 110 is lower than the top level of the isolation regions 120. A pair of floating gates 124 is disposed on the active regions and self-aligned with the isolation regions, whereby the top level of the floating gate is level with the top level of the isolation regions. A pair of control gates 134 are self-aligned with the floating gates 124 and disposed on the floating gates along a second direction. A source line 164 is a polysilicon source plug directly connected to the source region 112, disposed between the pair of control gates 134 along the second direction. A pair of select gates 162a and 162b are disposed on the outer sidewalls of the pair of control gate stacks along the second direction, wherein the floating gates are self-aligned with the source line, as shown in FIG. 3J.

In another aspect of the invention, the source line is a self aligned source (SAS) formed by STI etching and source line implantation.

Figure 4A:
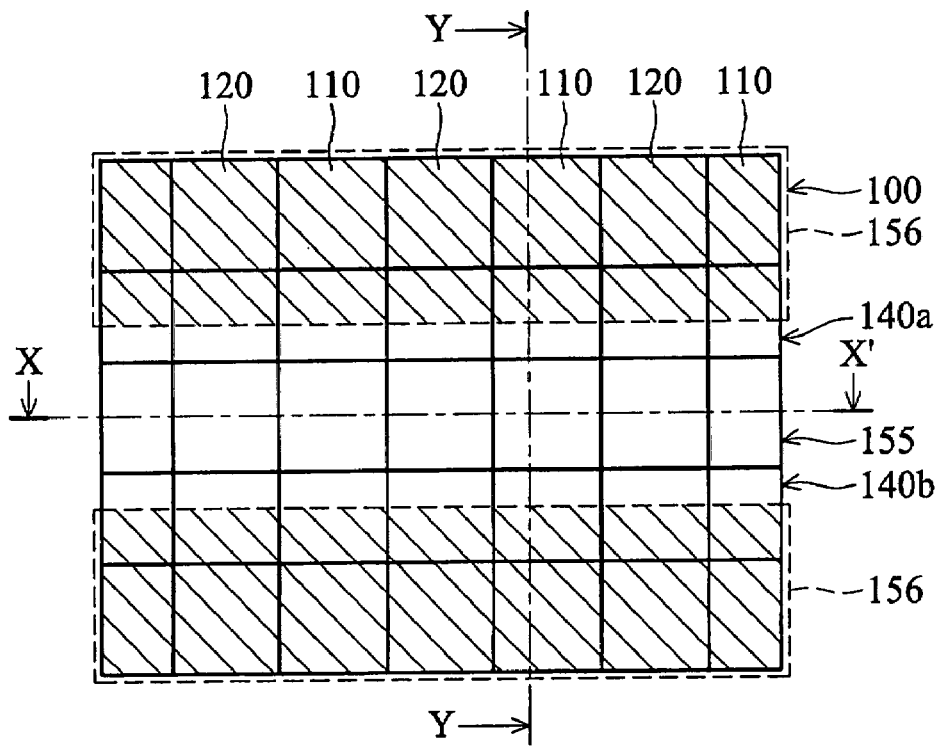
FIG. 4A is a plan view of the stacked pairs of floating gates and control gates on the semiconductor substrate.
Figure 4B:
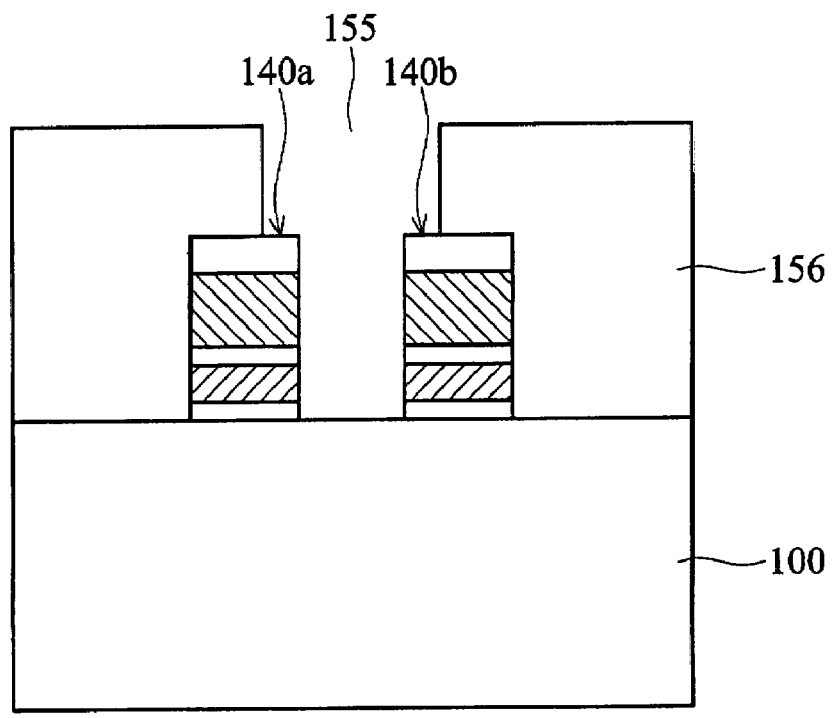
FIG. 4B is a cross section taken along line Y-Y of FIG. 4A.

FIG. 4A is a plan view of the stacked pairs of floating gates and control gates on the semiconductor substrate. FIG. 4B is a cross section taken along line Y-Y of FIG. 4A. The process of FIG. 4B is generally similar to the process of FIGS. 2A-2K and for simplicity its detailed description is omitted. A photoresist layer 156 is formed on the semiconductor substrate 100 and lithographically developed exposing a portion 155 of the pair of the stacked structures 140a, 140b and regions therebetween.

Figure 4C:
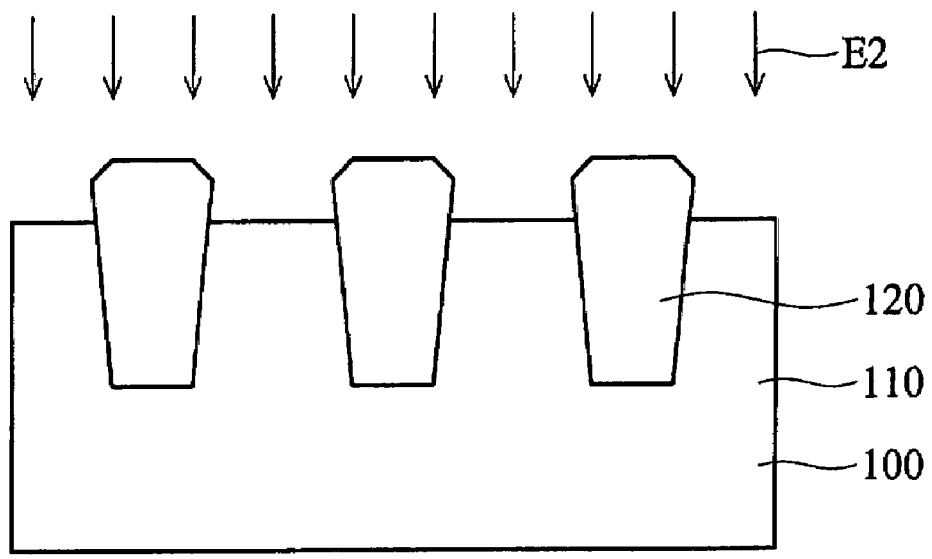
FIG. 4C is a cross section showing an etching procedure performed on the semiconductor substrate of FIG. 4A taken along line X-X.

FIG. 4C is a cross section showing etching performed on the semiconductor substrate taken along line X-X of FIG. 4A. Anisotropic etching E2 such as wet etching, dry etching or ion reactive dry etching (RIE) removes shallow trench insulator (STI) regions 120. The shallow trench insulator (STI) regions 120 can be removed by diluted HF solution or buffered oxide etching (BOE) to expose the surface of the semiconductor substrate 100.

Figure 4D:
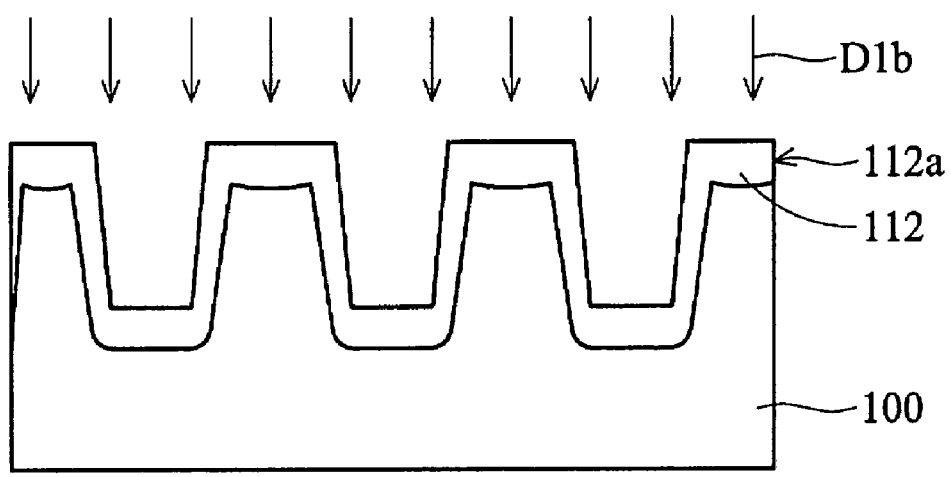
FIG. 4D is a cross section showing ion implantation performed on the semiconductor substrate.

FIG. 4D is a cross section showing ion implantation performed on the semiconductor substrate taken along line X-X of FIG. 4A. In FIG. 4D, ion implantation D1b is sequentially performed to implant dopants into the semiconductor substrate 100 to create a continuous doped region 112a, whereby source regions 112 are electrically connected. Ion implantation D1b is preferably performed, using arsenic or phosphorous ions at a doping energy between about 35 to 50 KeV, at a dose between about $1 \times 10^{14}$ and $6 \times 10^{15}$ atoms/cm$^2$, forming heavily doped, N type doped region 112a.

Figure 4E:
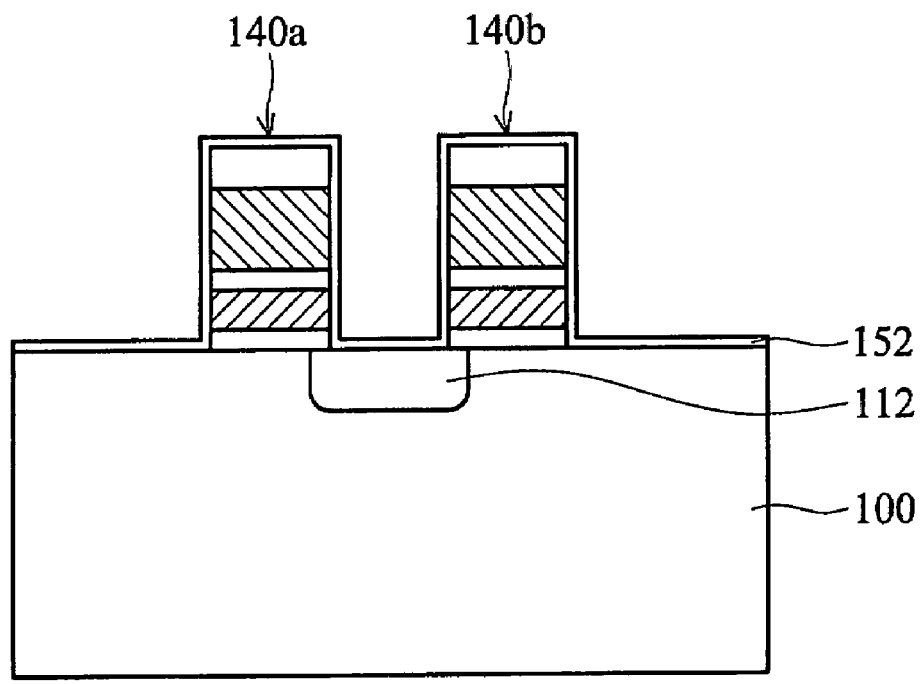
FIG. 4E is a cross section showing formation of an oxide layer on the semiconductor substrate taken along line Y-Y of FIG. 4A.
Figure 4F:
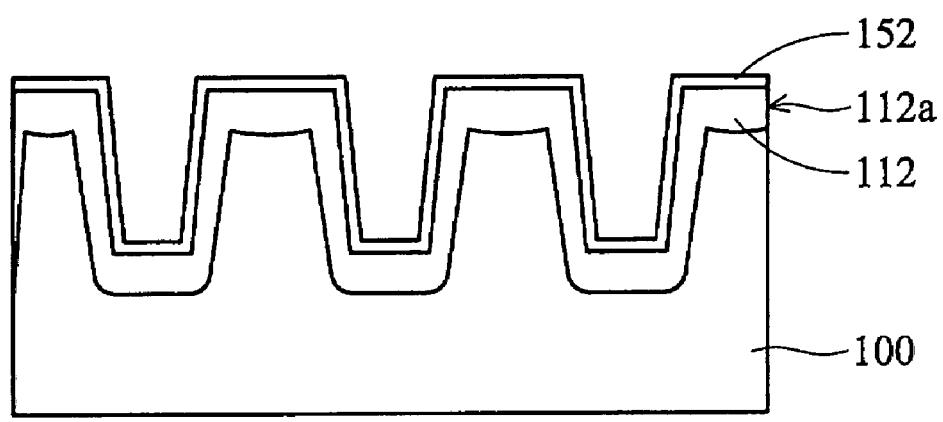
FIG. 4F is a cross section showing formation of an oxide layer on the semiconductor substrate taken along line X-X of FIG. 4A.

FIG. 4E is a cross section showing formation of an oxide layer on the semiconductor substrate taken along line Y-Y of FIG. 4A. FIG. 4F is a cross section of FIG. 4E taken along line X-X. Subsequently, an oxide layer 152 is conformably formed on the semiconductor substrate 100. The oxide layer 152 can be obtained using rapid process oxidation (RPO) or via low pressure chemical vapor deposition (LPCVD) or plasma enhanced chemical vapor deposition (PECVD).

Figure 4G:
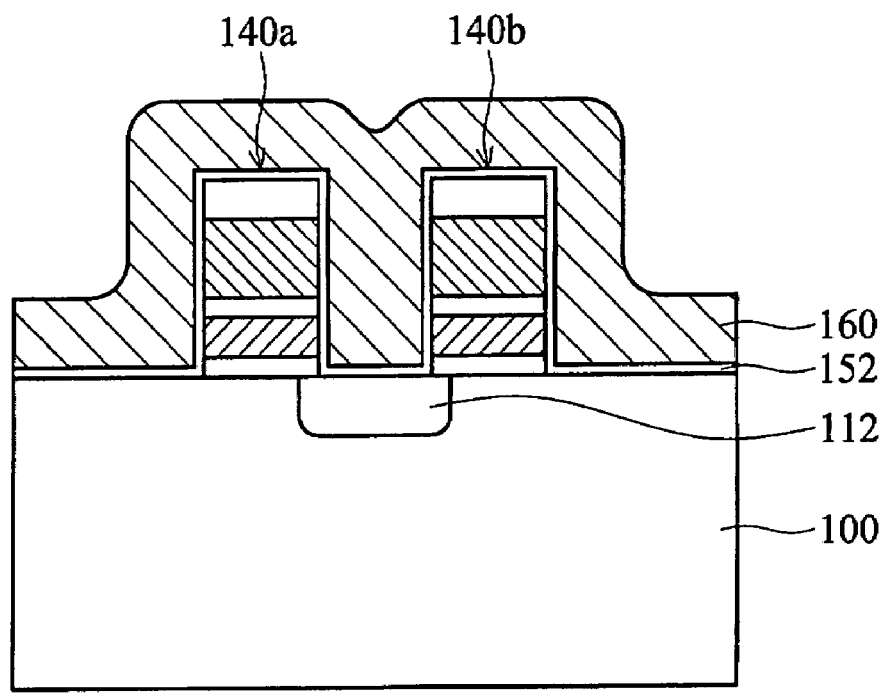
FIG. 4G is a cross section showing deposition of a polysilicon layer on the semiconductor substrate taken along line Y-Y.
Figure 4H:
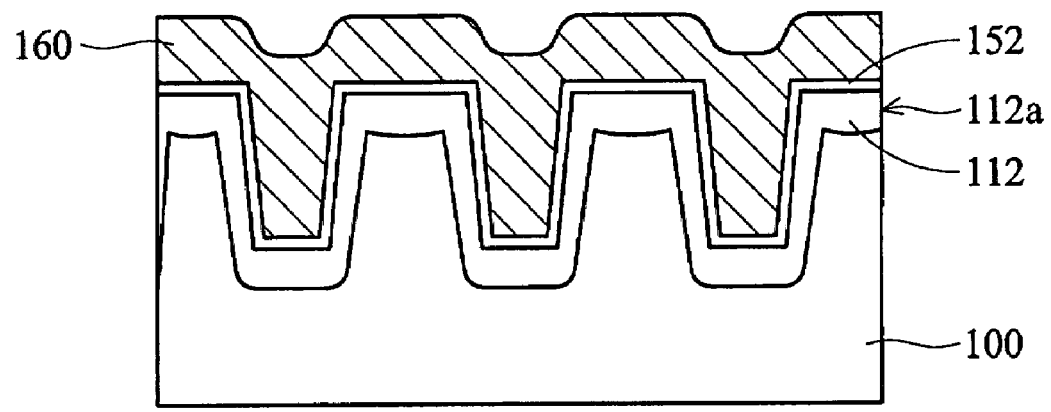
FIG. 4H is a cross section showing deposition of a polysilicon layer on the semiconductor substrate taken along line X-X.

FIG. 4G is a cross section showing deposition of a polysilicon layer on the semiconductor substrate taken along line Y-Y. FIG. 4H is a cross section showing deposition of a polysilicon layer on the semiconductor substrate taken along line X-X. Referring to FIG. 4G, a polysilicon layer 160 is conformably formed on the semiconductor substrate 100. The polysilicon layer 160 can be doped in situ during deposition, via the addition of arsine or phosphine to a silane ambient. Alternatively, the polysilicon layer 160 can be deposited intrinsically then doped via implantation of arsenic or phosphorous ions.

Figure 4I:
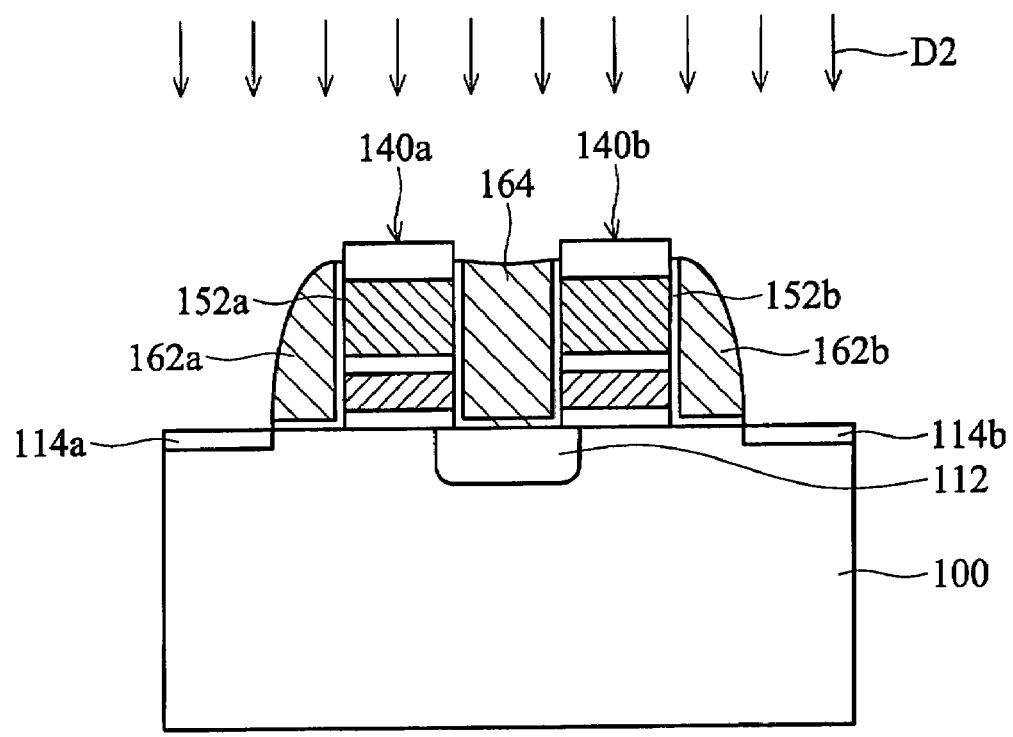
FIG. 4I is a cross section showing creation of source lines and selected gates on the semiconductor substrate.

FIG. 4I is a cross section showing creation of source lines and selected gates on the semiconductor substrate taken along line Y-Y. Anisotropic etching such as RIE creates a source line (SL) 164 between the pair of control gates 140a and 140b along the second direction. Source line 164 does not directly contact the source region 112. A pair of select gates 162a and 162b is simultaneously created on the outer sidewalls of the pair of control gates 140a and 140b along the second direction. Floating gates (FG) are self-aligned with the source line (SL). A pair of light doped drain/sources (LDD) 114a and 114b is formed in the semiconductor substrate 100 by ion implantation D2.

Figure 4J:
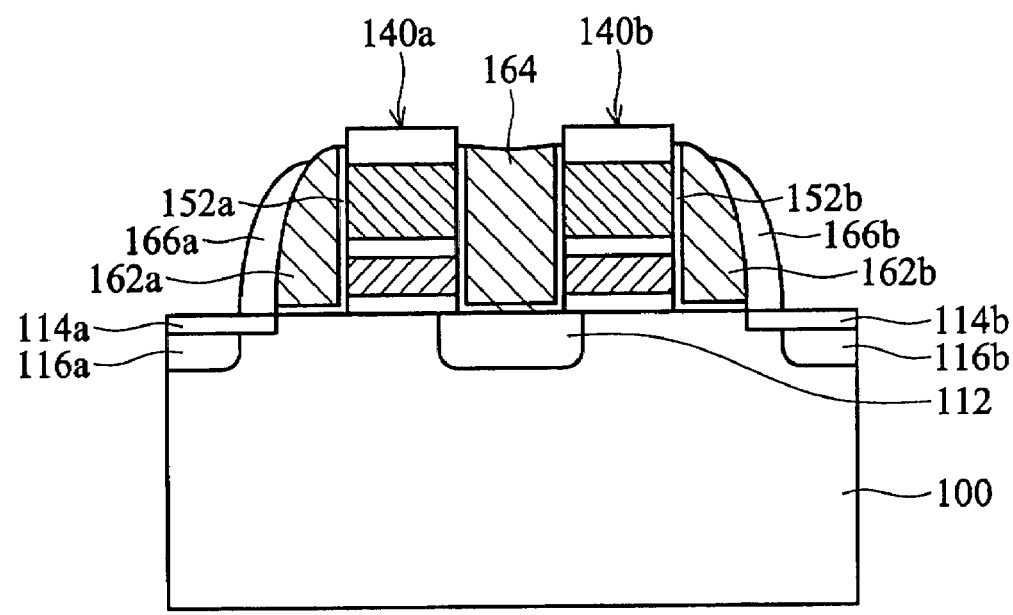
FIG. 4J is a cross section showing formation of dielectric spacers on the select gates.

FIG. 4J is a cross section showing formation of dielectric spacers on the select gates. A dielectric layer is conformably formed on the semiconductor substrate 100 and anisotropically etched partially leaving dielectric spacers 166a and 166b on the select gates 162a and 162b. Critical anisotropic etching is performed via RIE procedures terminated at the portion of dielectric spacers 166a and 166b on the sidewall of the select gates 162a and 162b.

An ion implantation is subsequently performed to create a pair of highly doped drain/source (HDD) regions 116a and 116b in the semiconductor substrate 100, preferably using arsenic or phosphorous ions at a doping energy between about 35 to 50 KeV, at a dose between about $1 \times 10^{14}$ and $6 \times 10^{15}$ atoms/cm$^2$, forming heavily doped, N type drain regions 116a and 116b in areas not covered by the control gate and dielectric spacers structures.

Figure 4K:
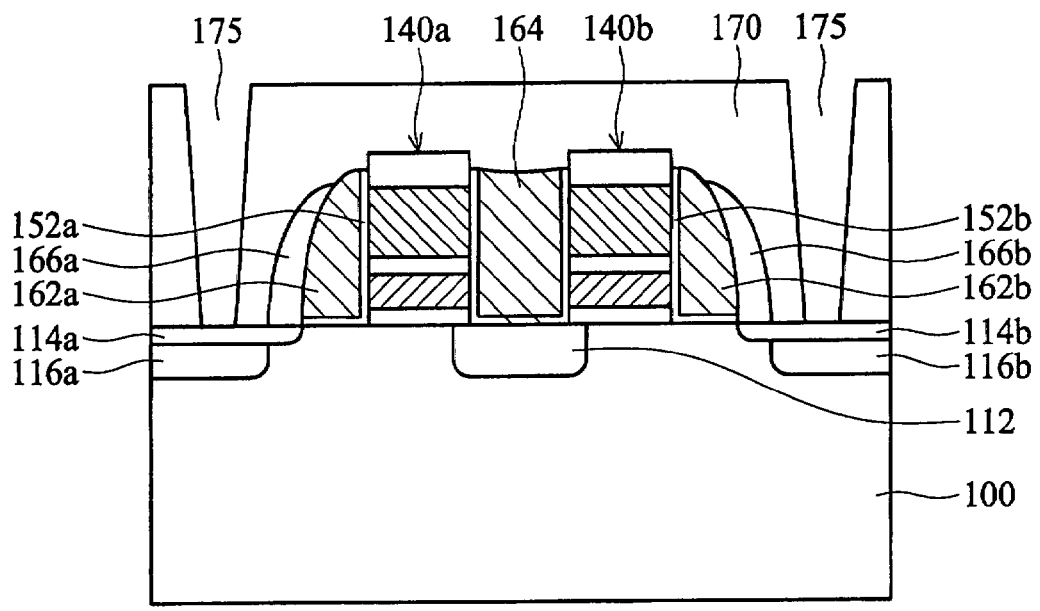
FIG. 4K is a cross section showing formation of an interlayer dielectric (ILD) on the semiconductor substrate.

FIG. 4K is a cross section showing formation of an interlayer dielectric (ILD) on the semiconductor substrate. An ILD layer 170 is patterned forming openings 175 exposing the drain regions 116a and 116b.

Figure 4L:
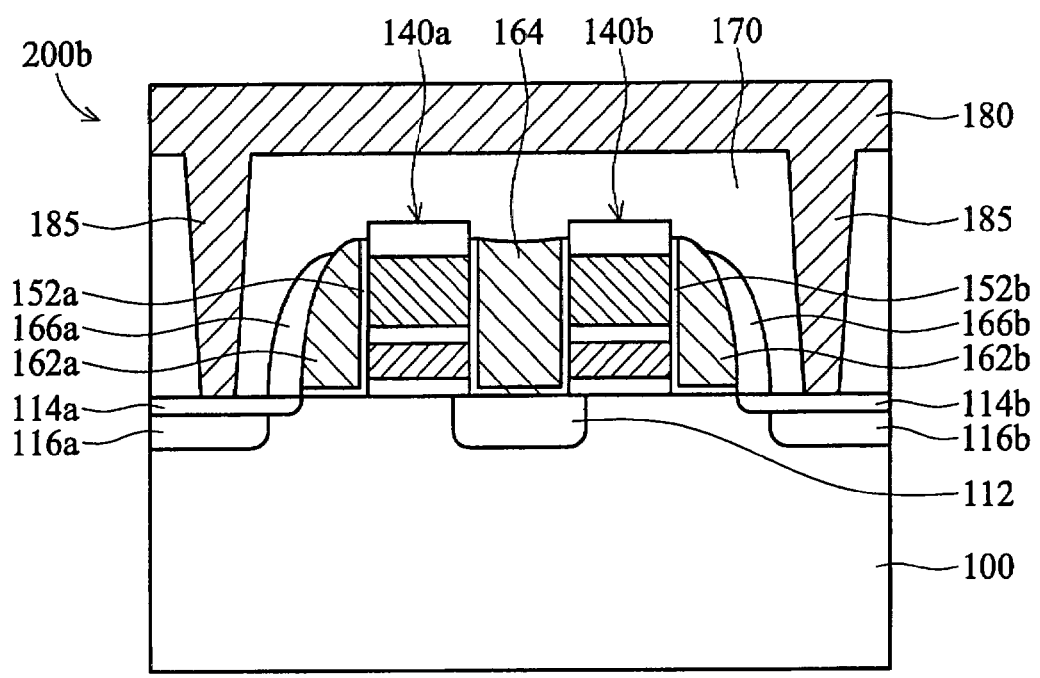
FIG. 4L is a cross section showing metallization of bit lines and contact plugs of the split-gate memory.

FIG. 4L is a cross section showing metallization of bit lines and contact plugs of the split-gate memory. A metal layer 180 is formed on the ILD layer 170 filling the opening 175 to serve as metal contact. For example, metallization can subsequently be applied and etched to form bit lines 180 and self-aligned bit line contacts 185.

Figure 4M:
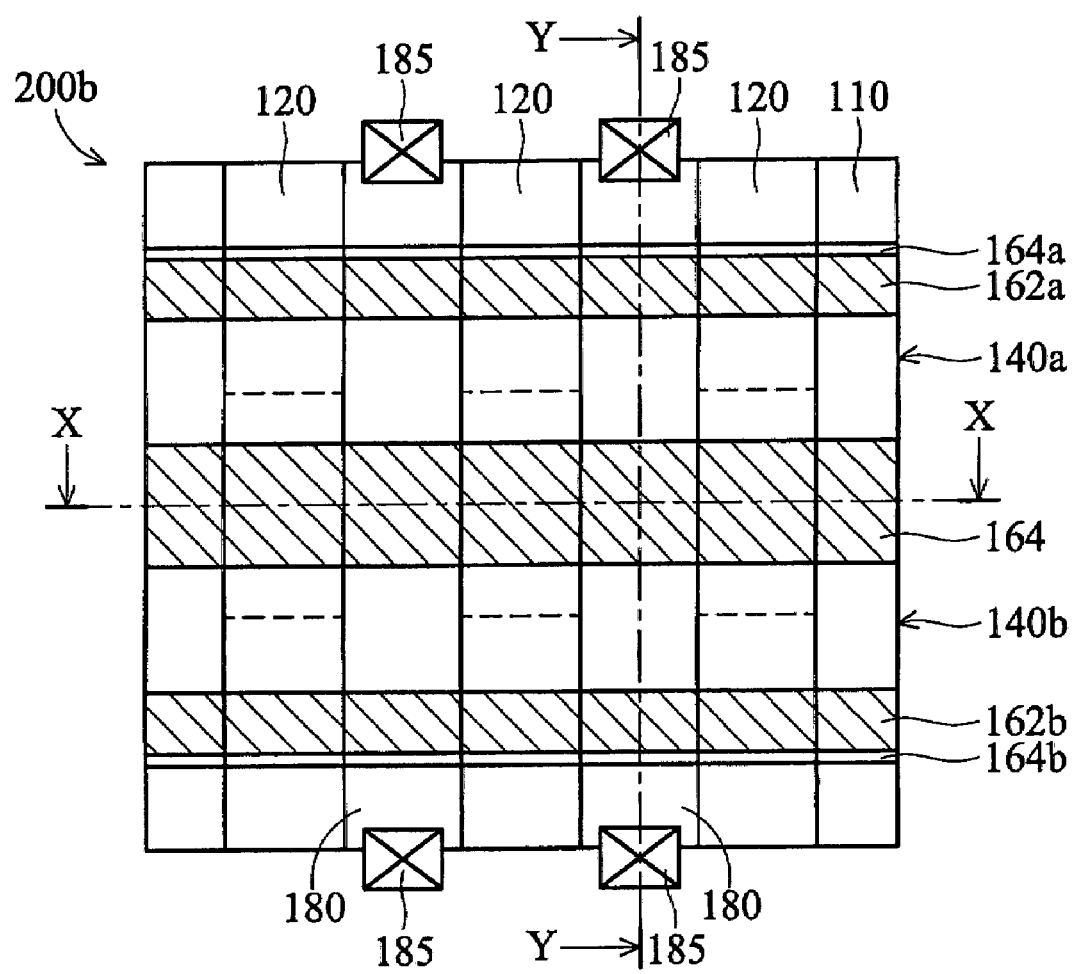
FIG. 4M is a plan view of a split-gate memory cell according to another embodiment of the invention.

Accordingly, in another aspect of the invention, a split-gate nonvolatile memory cell 200b is provided. Adjacent isolation regions 120 are formed on a semiconductor substrate 100 along a first direction. The adjacent isolation regions 120 define an active region 110 having a pair of drains 116a, 116b and a source region 112, wherein the top level of the active region 110 is lower than the top level of the isolation regions 120. A pair of floating gates 124 is disposed on the active regions and self-aligned with the isolation regions, whereby the top level of the floating gate is level with the top level of the isolation regions. A pair of control gates 134 is self-aligned with the floating gates 124 and disposed on the floating gates along a second direction. A source line 164 does not directly contact the source region 112, and is disposed between the pair of control gates 134 along the second direction. The source regions 112 along the second direction are electrically connected by a continuous doped region. A pair of select gates 162a and 162b is disposed on the outer sidewalls of the pair of control gate stacks along the second direction, wherein the split gates are self-aligned with the floating gates, as shown in FIG. 4M.

Figure 5A:
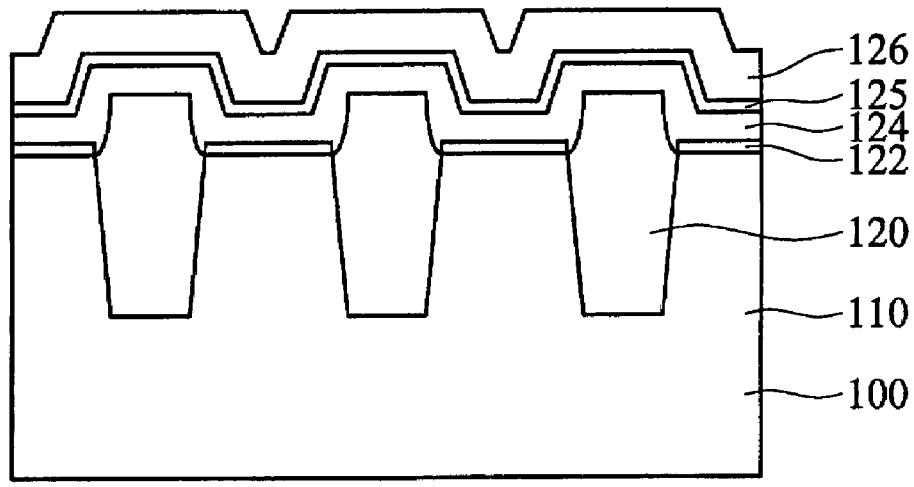
FIGS. 5A-5D are cross sections of another exemplary embodiment of formation of an oxide layer and a polysilicon layer on the semiconductor substrate.

FIGS. 5A-5D are cross sections of another exemplary embodiment of formation of an oxide layer and a polysilicon layer on the semiconductor substrate. In order to prevent floating gate thinning during CMP, a passivation layer is disposed on the floating gate. In FIG. 5A, an oxide layer 122 is formed on the substrate 100. The oxide layer 122 can be obtained using rapid process oxidation (RPO) or via low pressure chemical vapor deposition (LPCVD) or plasma enhanced chemical vapor deposition (PECVD). A first polysilicon layer 124, such as a PH$_3$-doped polysilicon, can be formed by chemical vapor deposition (CVD). A passivation layer 125 is conformably formed on the second polysilicon layer 124. The passivation layer 125 can be silicon oxide, silicon nitride, silicon oxynitride, or combinations thereof. A second polysilicon layer 126, such as a PH$_3$-doped polysilicon, is formed by chemical vapor deposition (CVD) on the passivation layer 125.

Figure 5B:
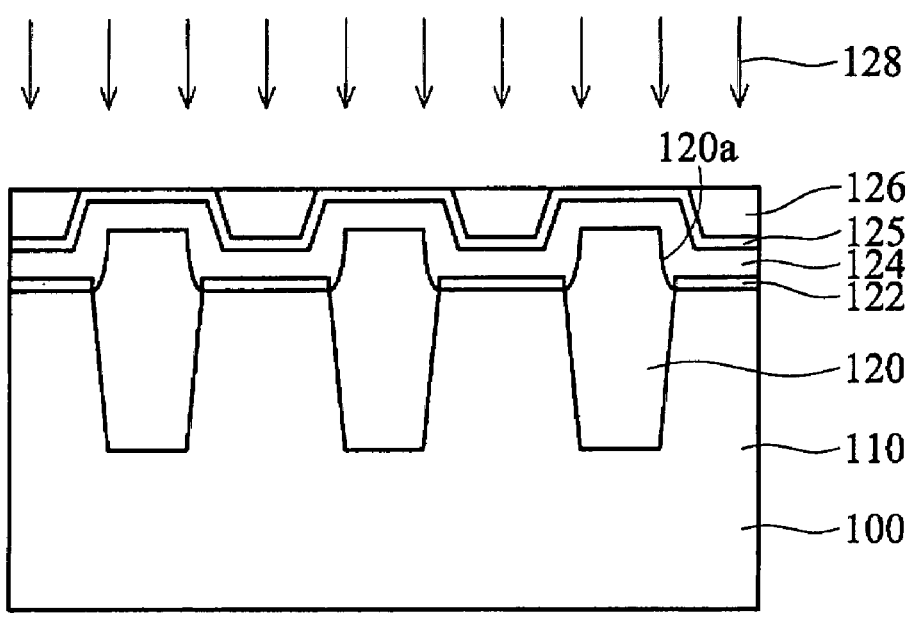

Referring to FIG. 5B, the semiconductor substrate 100 is sequentially planarized by chemical mechanical planarization (CMP) 128 partially removing the second polysilicon layer 126 to expose the passivation layer 125 above the isolation regions 120. The exposed passivation layer 125 above the isolation regions 120 is subsequently removed by etching, thereby exposing the underlying first polysilicon layer 124.

Figure 5C:
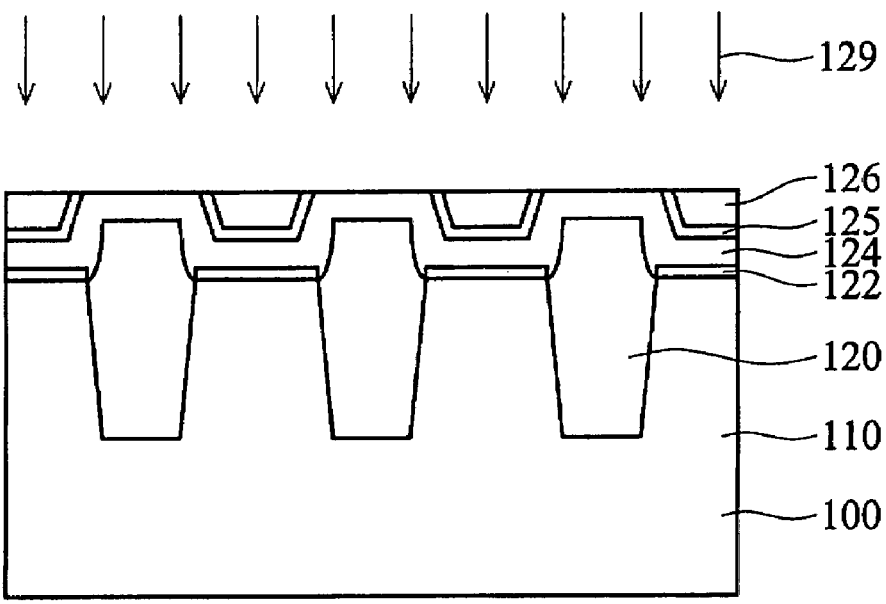
Figure 5D:
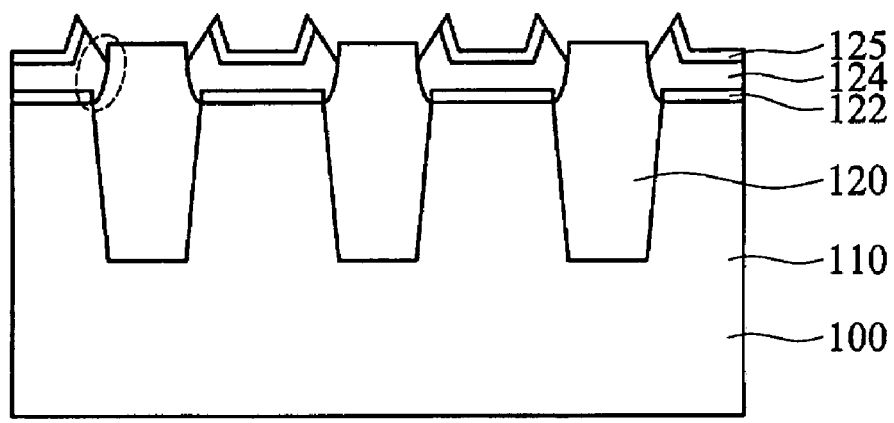

Referring to FIG. 5C, a dry etching process 129 is performed to remove the exposed first polysilicon layer 124 above the isolation regions 120 and the exposed second polysilicon layer 126 above the active region 110. After dry etching, the isolation regions 120 are exposed and the thickness of first polysilicon layer 124 above the active region 110 is preserved due to protection from the passivation layer 125. The oxide layer 110 and polysilicon layer 120 on the active region 110 are thus aligned with and parallel to the isolation regions 120 along the first direction and serve as a floating gate (FG) of the memory cell as shown in FIG. 5D.

Additional steps, not disclosed, are substantially identical to fabrication steps shown in FIGS. 2E-3J, and for simplicity their detailed description is omitted herefrom. Other steps not shown are required to complete the split-gate memory device, but are not essential to an understanding of the invention.

Figure 6A:
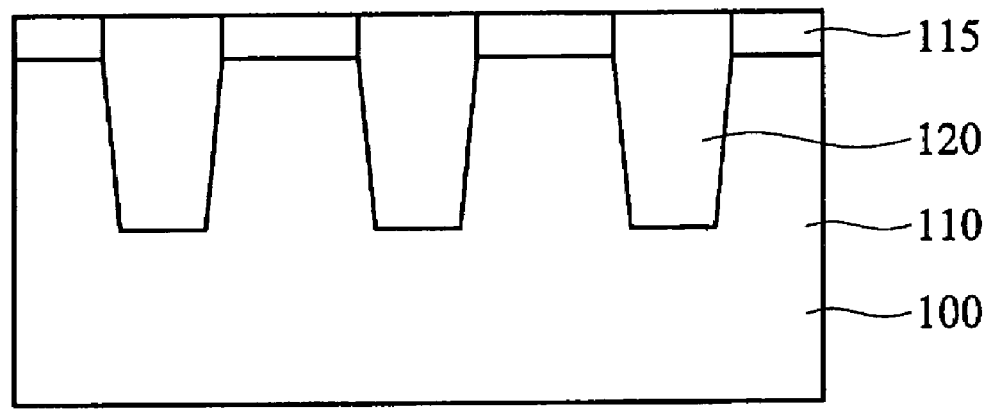
FIGS. 6A-6G are cross sections of another exemplary embodiment of formation of an oxide layer and a polysilicon layer on the semiconductor substrate.

FIGS. 6A-6G are cross sections of another exemplary embodiment of formation of an oxide layer and a polysilicon layer on the semiconductor substrate. In order to ensure the fabrication quality of the etching process without damage to corners of the active region, a multiple-pullback process can be executed. In FIG. 6A, a plurality of parallel adjacent isolation regions 120 is formed on a semiconductor substrate 100 along a first direction. An active region 110 is defined by a mask layer 115 between the adjacent isolation regions 120. The mask layer can be silicon nitride or silicon oxynitride. Isolation regions 120 are formed to define electrically separated active regions 110. The mask layer 115 is level with the top level of the isolation region 120.

Figure 6B:
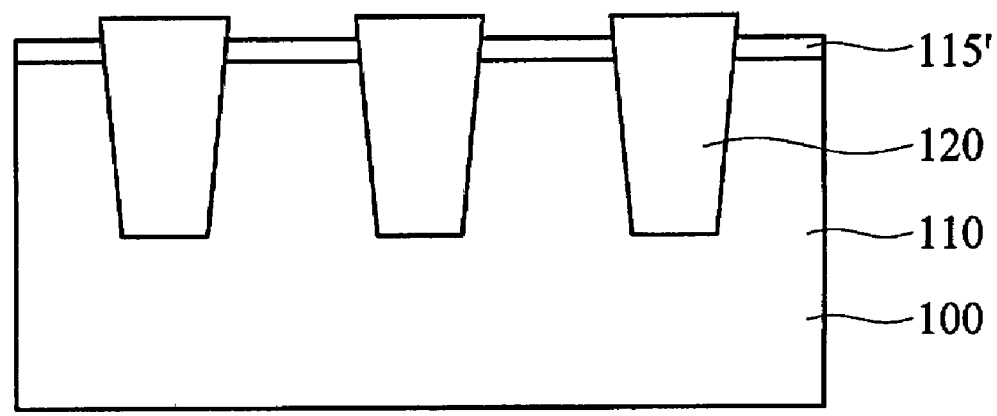
Figure 6C:
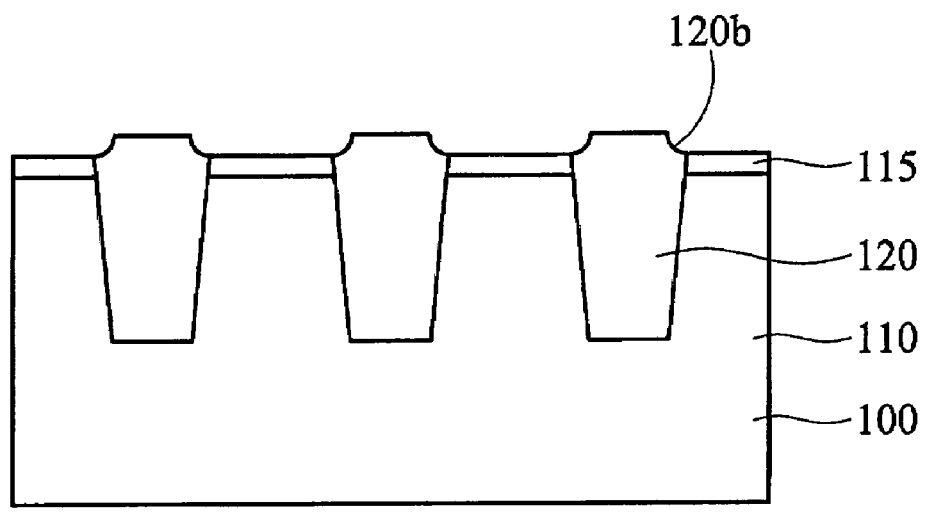

Referring to FIG. 6B, the mask layer 115 is partially thinned by etching. The top corners of the isolation region 120 are etched to create a first pullback concave 120b, as shown in FIG. 6C.

Figure 6D:
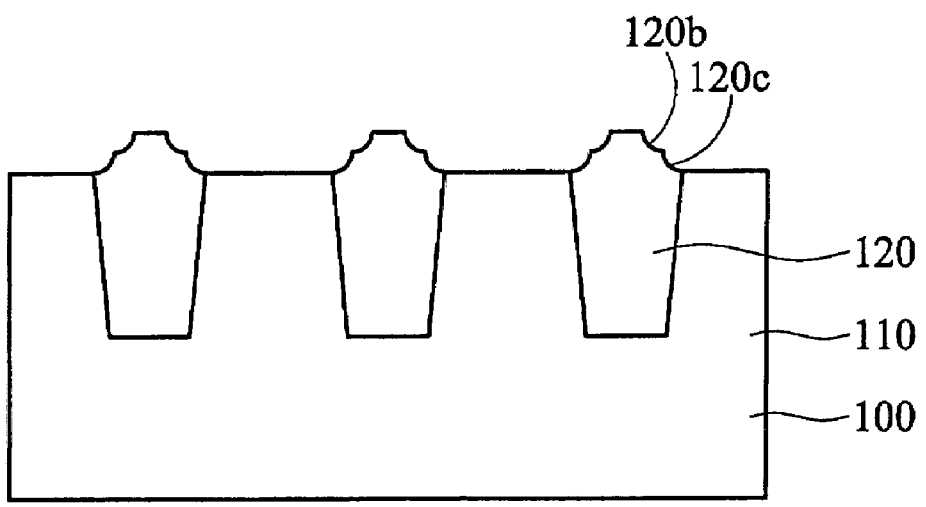

Referring to FIG. 6D, the thinned mask layer 115' is removed by etching. The top corners of the isolation region 120 are etched to create a second pullback concave 120c.

Figure 6E:
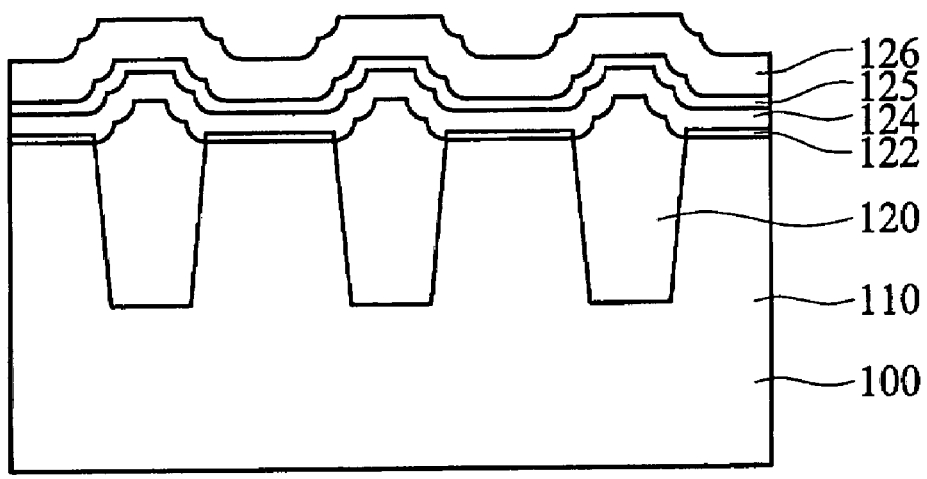
Figure 6F:
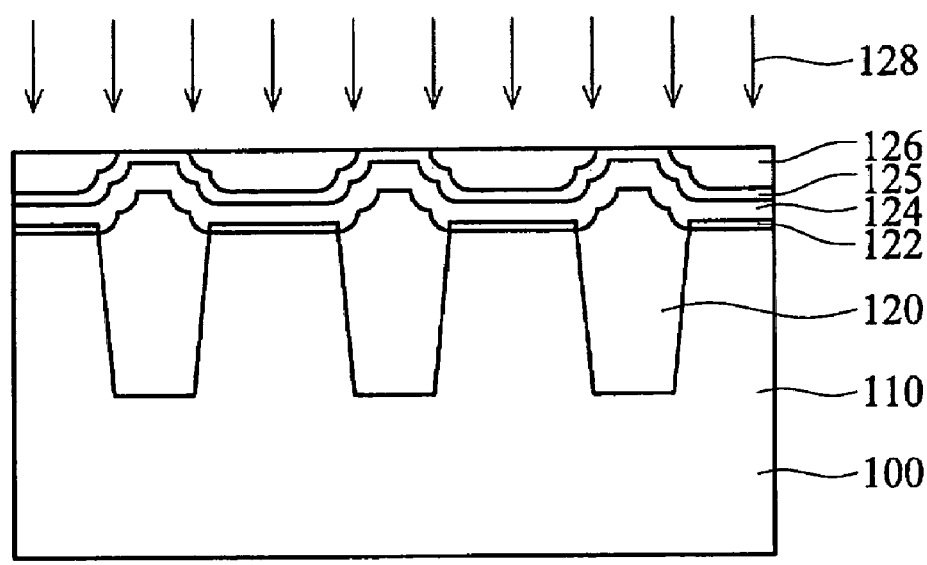

In order to prevent floating gate thinning during CMP, a passivation layer is disposed on the floating gate. Referring to FIG. 6E, an oxide layer 122 is formed on the substrate 100. The oxide layer 122 can be obtained using rapid process oxidation (RPO) or via low pressure chemical vapor deposition (LPCVD) or plasma enhanced chemical vapor deposition (PECVD). A first polysilicon layer 124, such as a PH$_3$-doped polysilicon, can be formed by chemical vapor deposition (CVD). A passivation layer 125 is conformably formed on the second polysilicon layer 124. The passivation layer 125 can be silicon oxide, silicon nitride, silicon oxynitride, or combinations thereof. A second polysilicon layer 126, such as a PH$_3$-doped polysilicon, is formed by chemical vapor deposition (CVD) on the passivation layer 125.

Referring to FIG. 5B, the semiconductor substrate 100 is sequentially planarized by chemical mechanical planarization (CMP) 128 partially removing the second polysilicon layer 126 to expose the passivation layer 125 above the isolation regions 120. The exposed passivation layer 125 above the isolation regions 120 is subsequently removed by etching, thereby exposing the underlying first polysilicon layer 124.

Figure 6G:
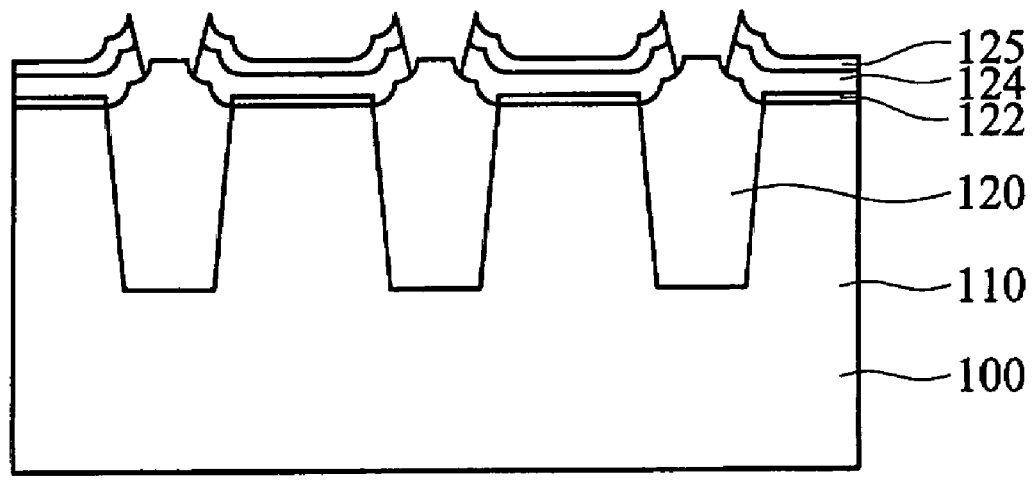

Referring to FIG. 6G, dry etching removes the exposed first polysilicon layer 124 above the isolation regions 120 and the exposed second polysilicon layer 126 above the active region 110. After dry etching, the isolation regions 120 are exposed and the thickness of first polysilicon layer 124 above the active region 110 is preserved due to protection from the passivation layer 125. Since the isolation region 120 is executed in a multiple pullback process, the passivation layer 125 partially overlaps the isolation region 120. The corners of the active region can thus be protected by overlapped passivation layer. The oxide layer 110 and polysilicon layer 120 on the active region 110 are thus aligned with and parallel to the isolation regions 120 along the first direction and serve as a floating gate (FG) of the memory cell.

Additional steps, not disclosed, are substantially identical to fabrication steps shown in FIGS. 2E-3J, and for simplicity are omitted herefrom. Other steps are required to complete the split-gate memory device, but are not essential to an understanding of the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A split-gate memory cell, comprising:
   a plurality of isolation regions formed on a semiconductor substrate along a first direction, between two adjacent isolation regions defining an active region having a pair of drains and a continuously doped source region along a second direction formed in the semiconductor substrate, wherein a top level of the active regions is lower than a top level of the isolation regions;
   a pair of floating gates disposed on the active regions and aligned with the isolation regions, wherein a passivation layer is disposed on the pair of floating gates to prevent thinning from CMP;
   a pair of control gates self-aligned with the pair of floating gates and disposed on the pair of floating gates along the second direction;
   an oxide layer conformably and continuously formed along the continuously doped source region and a sidewall of a stacked structure of the floating gates and the control gates;
   a source line between the pair of control gates along the second direction; and
   a pair of select gates disposed on outer sidewalls of the pair of control gates respectively along the second direction, wherein the first direction is perpendicular to the second direction.

2. The split-gate memory cell according to claim 1, wherein the passivation layer partially overlaps the isolation regions.

3. The split-gate memory cell according to claim 2, wherein both the left and right edges of the isolation regions comprise two concaves.

4. The split-gate memory cell according to claim 1, wherein the source line is self-aligned with the pair of floating gates along the second direction.

5. The split-gate memory cell according to claim 1, wherein the source line is a polysilicon plug directly connected to the source region.

6. The split-gate memory cell according to claim 1, wherein the source region is electrically connected by a continuous doped region, and wherein the source line does not directly contact the source region.

7. The split-gate memory cell according to claim 1, wherein the pair of split gates is self-aligned with the pair of floating gates.

8. A split-gate memory cell, comprising:
a plurality of isolation regions formed on a semiconductor substrate along a first direction, between two adjacent isolation regions defining an active region having a pair of drains and a continuously doped source region along a second direction formed in the semiconductor substrate, wherein a top level of the active regions is lower than a top level of the isolation regions;
a pair of floating gates disposed on the active regions and aligned with the isolation regions, wherein a passivation layer is disposed on the pair of floating gates to prevent thinning from CMP;
a pair of control gates self-aligned with the pair of floating gates and disposed on the pair of floating gates along the second direction;
an oxide layer conformably and continuously formed along the continuously doped source region and a sidewall of a stacked structure of the floating gates and the control gates;
a source line directly connected to the source region and disposed between the pair of control gates along the second direction; and
a pair of select gates disposed on outer sidewalls of the pair of control gates along the second direction,
wherein the first direction is perpendicular to the second direction.

9. The split-gate memory cell according to claim 8, wherein the passivation layer partially overlaps the isolation regions.

10. The split-gate memory cell according to claim 9, wherein both the left and right edges of the isolation regions comprise two concaves.

11. The split-gate memory cell according to claim 8, wherein the source line is self-aligned with the pair of floating gates along the second direction.

12. The split-gate memory cell according to claim 8, wherein the source line comprises a polysilicon plug.

13. The split-gate memory cell according to claim 8, wherein the pair of split gates are self-aligned with the pair of floating gates.

14. A split-gate memory cell, comprising:
a plurality of isolation regions formed on a semiconductor substrate along a first direction, between two adjacent isolation regions defining an active region having a pair of drains and a continuously doped source region along a second direction formed in the semiconductor substrate, wherein a top level of the active regions is lower than a top level of the isolation regions;
a pair of floating gates disposed on the active regions and aligned with the isolation regions, wherein a passivation layer is disposed on the pair of floating gates to prevent thinning from CMP;
a pair of control gates self-aligned with the pair of floating gates and disposed on the pair of floating gates along the second direction;
an oxide layer conformably and continuously formed along the continuously doped source region and a sidewall of a stacked structure of the floating gates and the control gates;
a source line electrically connected by a continuous doped region and disposed between the pair of control gates along the second direction, wherein the source line does not directly contact the source region; and
a pair of select gates disposed on the outer sidewalls of the pair of control gates along the second direction,
wherein the first direction is perpendicular to the second direction.

15. The split-gate memory cell according to claim 14, wherein the passivation layer partially overlaps the isolation regions.

16. The split-gate memory cell according to claim 15, wherein both the left and right edges of the isolation regions comprise two concaves.

17. The split-gate memory cell according to claim 14, wherein the source line is self-aligned with the floating gates along the second direction.

18. The split-gate memory cell according to claim 14, wherein the pair of split gates is self-aligned with the pair of floating gates.

* * * * *